United States Patent
Wang et al.

(10) Patent No.: US 7,366,652 B2
(45) Date of Patent: *Apr. 29, 2008

(54) METHOD OF PROGRAMMING A CO-VERIFICATION SYSTEM

(75) Inventors: Ming Yang Wang, Lafayette, CA (US); Duan-Ping Chen, San Jose, CA (US); Swey Yan Shei, Cupertino, CA (US); Hung Chun Chiu, Fremont, CA (US); Neu Choo Ngui, Fremont, CA (US)

(73) Assignee: Springsoft, Inc., Hsinchu (TW)

( * ) Notice: Subject to any disclaimer, the term of this patent is extended or adjusted under 35 U.S.C. 154(b) by 277 days.

This patent is subject to a terminal disclaimer.

(21) Appl. No.: 11/230,999

(22) Filed: Sep. 19, 2005

(65) Prior Publication Data
US 2006/0015313 A1 Jan. 19, 2006

Related U.S. Application Data

(63) Continuation-in-part of application No. 10/463,057, filed on Jun. 16, 2003, now Pat. No. 7,072,825, and a continuation-in-part of application No. 10/735,342, filed on Dec. 11, 2003, now Pat. No. 7,120,571.

(51) Int. Cl.
*G06F 9/44* (2006.01)
*G06F 13/00* (2006.01)

(52) U.S. Cl. .............. 703/28; 703/21; 703/24; 716/4

(58) Field of Classification Search .......... 703/23, 703/28, 21, 24; 716/8, 4
See application file for complete search history.

(56) References Cited

U.S. PATENT DOCUMENTS

| | | | | |
|---|---|---|---|---|
| 7,035,787 | B2* | 4/2006 | Reblewski | 703/28 |
| 7,072,825 | B2* | 7/2006 | Wang et al. | 703/28 |
| 2004/0034841 | A1* | 2/2004 | Reblewski | 716/8 |
| 2004/0260530 | A1* | 12/2004 | Josso et al | 703/23 |
| 2005/0027505 | A1* | 2/2005 | Montagne et al. | 703/23 |

\* cited by examiner

*Primary Examiner*—Thai Phan
(74) *Attorney, Agent, or Firm*—Daniel J. Bedell; Smith-Hill and Bedell

(57) ABSTRACT

A co-verification system includes a computer programmed to act as a simulator for simulating behavior of a first portion of an electronic device under test (DUT) by acquiring, processing and generating data representing DUT signals. The co-verification system also includes emulation resources programmed to emulate a second portion of the DUT by receiving, processing and generating emulation signals representing DUT signals. The signals of the DUT are mapped to separate addresses within a memory space, and the simulator controls and reads states of emulation signals by writing data to and reading data from addresses of the memory space states mapped to the DUT signals the emulation signals represent. The computer and the emulation resources are also programmed to implement transactors communicating with one another through a packet routing network. The transactors set states of the emulation signals when the simulator writes to memory space addresses and for reading states of the emulation signals. The transactors monitor states of emulation signals and return data indicating those states to the simulator when the simulator reads memory space addresses mapped to DUT signals represented by the emulation signals.

22 Claims, 12 Drawing Sheets

METHOD OF PROGRAMMING A CO-VERIFICATION SYSTEM

CROSS-REFERENCE TO RELATED APPLICATION

This is a continuation-in-part of U.S. patent application Ser. No. 10/463,057, filed Jun. 16, 2003 now U.S. Pat. No. 7,072,825, a continuation-in-part of U.S. patent application Ser. No. 10/735,342, filed Dec. 11, 2003 now U.S. Pat. No. 7,120,571.

BACKGROUND OF THE INVENTION

1. Field of the Invention

The present invention relates to a co-verification system employing programmable logic devices and other resources for verifying the behavior of an electronic circuit described by a netlist, and in particular to a method of programming such a co-verification system.

2. Description of Related Art

A typical digital integrated circuit (IC) employs register transfer logic (RTL) wherein each block of logic within the IC includes input and output registers for synchronizing state changes in its input and output signals to edges of a clock signal. Typically a designer will first generate an RTL level hardware description language (HDL) netlist employing Boolean expressions to characterize each block of logic. The designer then employs a synthesis tool to convert the high level netlist into a gate level HDL netlist describing the logic blocks as sets of cells interconnected by nets, where each cell is a standard IC component such as a transistor or a logic gate. The gate level netlist references each cell instance in the IC by referring to an entry for that cell type in a cell library, a database describing the behavior and the layout each kind of cell that can be included in an IC. After creating the gate level netlist, the designer employs a placement and routing (P&R) tool to convert the gate level netlist into an IC layout file indicating the position and layout within a semiconductor die of each cell forming the IC and describing how the nets are to be routed between cell terminals. The layout file guides fabrication of the IC.

Simulation

An IC designer usually employs various tools at each step of the design process to verify that an IC described by a netlist (or some portion thereof) will behave as expected in response to a pattern of input signals. One type of verification tool is a circuit simulator, a computer programmed to simulate the behavior of the IC by implementing a mathematical model of the IC. As illustrated in FIG. 1, to program a simulator, the designer develops a "testbench" 10 incorporating the netlist 12 describing the IC and a "vector file" 14 indicating how the IC's input signals are to change state over time. The testbench also indicates which IC signals that are to be monitored during the simulation. A compiler 16 then generates a program for a computer-based simulator 20 based on the testbench 10 and on the behavioral descriptions provided by the cell library 18 of instances of cells to be incorporated into the IC. As it executes the program, simulator 20 generates a "dump file" 22 indicating time time-varying behavior of the monitored IC signals that the designer can analyze to determine how the IC will behave.

Although a simulator can predict the behavior of an IC based on either an RTL level or gate level netlist, it can require much processing time to simulate IC behavior. To reduce processing time a designer can program a simulator to simulate only those portions of an IC design that are new or have been modified, but this approach may not provide sufficient assurance that the new and old portions of the design will properly work together.

Emulation

An emulator is another kind of verification tool a designer may use to verify the behavior of an IC described by a netlist. An emulator employs programmable logic devices (PLDs) such as, for example, field programmable gate arrays (FPGAs) to emulate the logic of the IC. For example U.S. Pat. No. 6,377,911 issued Apr. 23, 2002 to Sample et al, describes a logic emulation system employing FPGAs. Since the FPGAs employ logic gates rather than software to emulate circuits, emulation using FPGAs can often be much quicker than computer-based simulation.

As illustrated in FIG. 2 one or more compilers 24 compile the netlist 12 describing the IC and the cell library description of the cells to be included the IC into programs for the PLDs and any other programmable resources included in emulator 26. Another compiler 28 compiles the vector file 14 into a program for a pattern generator 30 for providing input signals to emulator 26. Compiler 28 also compiles a program for a data acquisition system 32, such as a logic analyzer, for monitoring various signals within emulator 26 to determine how the emulated circuit behaves in response to the input signals provided by pattern generator 30.

In-Circuit Emulation

An IC normally operates in the context of a host system such as a printed circuit board (PCB), communicating with other devices mounted on the PCB. In an in-circuit emulation (ICE) system, a circuit emulator is connected to a host system circuit in place of the IC it emulates so that the emulated IC can be tested within the intended operating environment of the IC. As illustrated in FIG. 3, an emulator 26 is connected through cables to an IC socket on a host system 34 in which the emulated IC will eventually be installed. During an emulation process, while the emulator communicates with host system 34 via input and output signals, a data acquisition system 32 acquires data representing the behavior of those signals that an IC designer can analyze to verify behavior of the emulated IC.

Emulation Hardware

FIG. 4 illustrates a typical prior art emulation system 40 including a set of circuit boards 42, each holding an array of FPGAs 44, with each FPGA programmed to emulate the logic of a large number of interconnected logic gates and storage devices such as flip-flops and registers. Each FPGA 44 has many I/O terminals and some of those I/O terminals are linked to I/O terminals of other FPGAs 44 on the same circuit board 42 so that the FPGAs can communicate with one another. Circuit boards 42 reside in slots on a motherboard 45 including a backplane providing signal paths between I/O terminals of FPGAs 44 residing on different circuit boards 42. In some systems, the signal paths between FPGAs or FPGA boards are linked via programmable routing devices such as crosspoint switches to provide more flexible signal routing between FPGAs. A conventional computer workstation 46 processes the user's netlist description of the emulated IC device under test (DUT) to produce a set of instructions for programming FPGAs 44 to emulate DUT logic. The workstation transmits those instructions to programming inputs of FPGA 44 via one or more input/output (I/O) interface cards 47 installed in a slot of the PCI bus of workstation 46.

A pattern generator 55 and a data acquisition circuit 56 may be mounted on circuit boards installed in motherboard 45 and linked through signals paths on the motherboard to I/O terminals of FPGAs 44. These circuits supply input signals to the FPGAs and monitor selected FPGA output signals during the emulation process to acquire "probe data" representing the behavior of the DUT output signals. Following the emulation process, a user may employ debugging software to analyze the data acquired by data acquisition system 56 to determine whether the DUT will behave as expected. When the emulator is employed for in-circuit emulation, a cable 52 provides signal paths between I/O terminals of FPGAs 44 and a socket of a host system 54.

Co-Verification

An IC may include large standardized components such embedded computer processors and memories, and in lieu of using programmable logic devices to emulate the behavior of such components, system 40 of FIG. 4, acting a "co-verification system" may employ a suitably programmed workstation 46 to simulate the behavior of an embedded processor and memory while the FPGAs 44 emulate various logic blocks of the IC. During the co-verification process, FPGAs and workstation 46 communicate though backplane wiring in motherboard 45. Processors and memory ICs mounted on other resource boards 48 installed in slots of motherboard 45 can be also used to simulate large component behavior.

FIG. 5 is a dataflow diagram illustrating how various parts of co-verification system 40 of FIG. 4 might implement an IC device under test (DUT) and the various test functions of a testbench using a co-verification process to simulate and emulate various modules of the DUT. The netlist included in the testbench describes the DUT as having several modules, and in this example workstation 46 simulates some of the DUT modules 60 while resource boards 42 emulate other DUT modules. In this example, software within workstation 46 also handles the test vector generation 62 and data acquisition 64 functions specified by the testbench. Backplane wiring on motherboard 45 of FIG. 4, cables and/or other interconnect systems provide signal routing 66 between workstation 46, resource boards 42, pattern generator 55 and data acquisition system 56. A "transactor" 68 implemented by software and hardware within workstation 46 provides an interface between the vector generator software 62, the data acquisition software 64, the DUT modules 60 simulated by workstation 46, and signal routing system 66. Signal routing system 66 routes output and input signals of DUT modules 61 to input and output terminals of transactor 68.

To change the state of one or more inputs to an emulated DUT module 61, simulated DUT modules 60 or vector generator 62 will send a high level "write" command to transactor 68 formatted, for example, as follows:

write location data

The "write" command indicates one or more DUT input signals identified by the "location" field of the command are to be driven to states indicated by the "data" field of the command. Transactor 68 responds to the write command by setting the input signals at the indicated DUT module 61 inputs to the indicated states. A DUT module 60 or data acquisition system 64 sends a "read" command to transactor 68 when it needs to determine the state of one or more DUT module 61 output signals. For example, the read command may appear as follows:

read location

The "location" field references the DUT module 60 output signals whose states are to be read.

The location field in the read and write commands identifies DUT module 61 input and output signals by identifying particular terminals of workstation 46 at which those signals appear. Thus when compiling programs for workstation 46 implementing DUT modules 60, vector generator 62 and data acquisition system 64, it is necessary to first map each signal through which DUT modules 61 communicate to separate hardware input/output (IO) terminals of workstation 46 because it is necessary for the compiler to know which terminals will transmit and receive each DUT module 61 IO. Conversely, when programming the PLDs on resource boards 42 to emulate modules 61, it is necessary to tell the compiler for the PLDs which terminals of workstation 46 are to send and receive the IO signals of module 61 input and output signals.

An IC designer will initially create a netlist using high level Boolean expressions to describe each IC module, but as the design process progresses the designer will employ synthesis and other tools to convert the high level netlist description of IC modules to gate level and lower level descriptions. In the co-verification system of FIG. 5, workstation 46 is best suited for implementing DUT modules 60 at a high level of abstraction while resource boards 42 are often better suited for implementing DUT modules 61 at a lower level of abstraction. As the IC design progresses, the designer may want to use the co-verification system several times, changing the manner in which DUT modules are allocated between workstation 46 and resource boards 42. For example a module may initially be simulated by workstation 46 while its design is at a high level of abstraction, and then later emulated by resource boards 42 after the designer has synthesized its gate level design.

One drawback to the co-emulation system of FIG. 4 is that it is necessary to use separate compilers to compile programs for each system component, since workstation 46, pattern generator 55, data acquisition system 56 and devices on resource boards 48 include different memories and map signals to different memory space addresses. The designer must carefully coordinate the compilers for the workstation software and the compilers for the PLDs so that the various parts of the co-verification system will properly communicate with one another during the co-verification process. When the designer wishes to reallocate a DUT module from workstation 46 to resource boards 42, it is necessary to not only compile a new resource program for that module but to also recompile programs for all other modules as well, because the IO terminal locations of the module that migrated from workstation to resources boards have changed. The compilers must change the write and read commands generated by vector generator 62, data acquisition block 64 and the remaining simulated DUT modules 60 to account for the new terminal locations of the migrated module. Since the time required to compile the PLD programs and workstation software can be considerable, the need to recompile this programming as the IC design progresses in order to verify the IC design at each stage of the design process significantly adds to the total time needed to design an IC.

BRIEF SUMMARY OF THE INVENTION

A co-verification system includes a computer and emulation resources interconnected by a communication path such as for example a packet routing network. The computer is programmed to act as a simulator for simulating behavior of a first portion of an electronic device under test (DUT) described by a netlist by acquiring, processing and generating data representing DUT signals. The emulation resources are programmed to emulate a second portion of the DUT by receiving, processing and generating emulator signals representing DUT signals. The signals of the DUT are mapped to separate addresses within a memory space, so that the simulator can control and monitor states of the emulator signals by writing data to and reading data from memory space address mapped to the DUT signals the emulator signals represent. The computer and the emulation resources are also programmed to implement transactors communicating with one another through the communication path. The transactors set the emulator signals to states indicated by data the simulator writes to memory space addresses mapped to DUT signals the emulation signals represent. The transactors also monitor states of emulation signals and return data indicating those states to the simulator when the simulator reads memory space addresses mapped to DUT signals the emulation signals represent.

By mapping the DUT signals to a memory space read and write accessed by the simulator, and relying on transactors to handle communication between the simulator and the emulator, simulator and emulator programming become transparent to one another. As long as the memory mapping remains unchanged, a change in simulator programming has no effect of emulator programming and a change in emulator programming has no effect on a simulator programming.

The claims appended to this specification particularly point out and distinctly claim the subject matter of the invention. However those skilled in the art will best understand both the organization and method of operation of what the applicant(s) consider to be the best modes of practicing the invention, together with further advantages and objects of the invention, by reading the remaining portions of the specification in view of the accompanying drawings wherein like reference characters refer to like elements.

DETAILED DESCRIPTION OF THE INVENTION

The invention relates to a method of programming a co-verification system that can be implemented by a conventional computer reading and executing software residing on computer-readable media such as, for example, compact disks, floppy disks, hard disks, read only memory, and random access memory. While the drawings and this section of the specification describe a preferred embodiment of the method in accordance with the invention, the claims appended to this specification describe the full scope of the invention. The preferred embodiment of the invention described below illustrates one example of the invention recited in the claims. A programming system in accordance with the invention may be employed to program a co-verification system as described in detail in co-pending U.S. patent application Ser. No. 10/463,057, filed Jun. 16, 2003, incorporated herein by reference, and in co-pending U.S. patent application Ser. No. 10/735,342, also incorporated herein by reference.

A netlist is a computer-readable data structure modeling an electronic circuit such as an integrated circuit (IC) or a portion of an IC. A netlist model of a circuit references each component of the circuit and indicates how nets are to interconnect terminals of the components to one another and to the circuit's input and output terminals. A testbench is a data structure that includes a netlist modeling a circuit, along with a model of the time varying behavior of the input signals to be applied to the circuit during a test. The testbench will also indicate which of various signals of interest produced by the circuit in response to the input signals are to be monitored during the test.

A circuit simulator is a computer programmed to simulate and test the behavior of a circuit described by a netlist by calculating the states of the signals to be monitored when the circuit is stimulated by input signals having the behavior described by the testbench. A circuit emulator employs programmable logic devices such as FPGAs to emulate the behavior of a circuit described by a netlist in response to input signals described by the testbench. An emulator will typically employ a programmable pattern generator to stimulate the emulated DUT with input signals having the behavior described by the testbench, and will employ a data acquisition system to sample the circuit signals during the test to provide data representing circuit behavior. The invention relates to a co-verification system that uses one or more computers to simulate some portions of a circuit described by a netlist while using programmable logic devices and/or other hardware resources to emulate other portions of the circuit.

Figure 6:
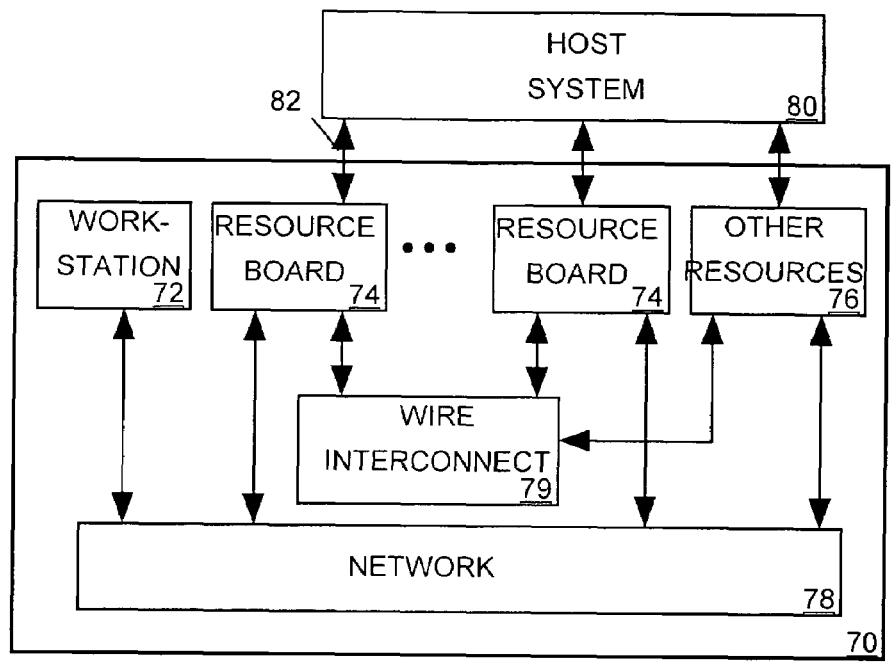
FIG. 6 illustrates a co-verification system in accordance with the invention.

Referring to FIG. 6, co-verification system 70 includes a workstation 72, one or emulation resource boards 74 and possibly other emulation resources 76 communicating through a packet routing network 78. The resource boards 74 may also communicate with one another through a wire interconnects 79 provided by cables or backplane wiring. Packet routing network 78 may be implemented, for example, as a standard IEEE 1394 "firewire" bus network with devices connected to the network being adapted to transmit and receive packets via using standard firewire bus protocol. Other types of packet routing networks protocols known to those of skill in the art may be used in lieu of a firewire bus to convey data packets between devices 72, 74 and 76. When co-verification system 70 acts as an in-circuit emulator, the resource boards 74 and other resources 76 communicate with a host system 80 via signals passing through cable interconnects 82.

Figure 7:
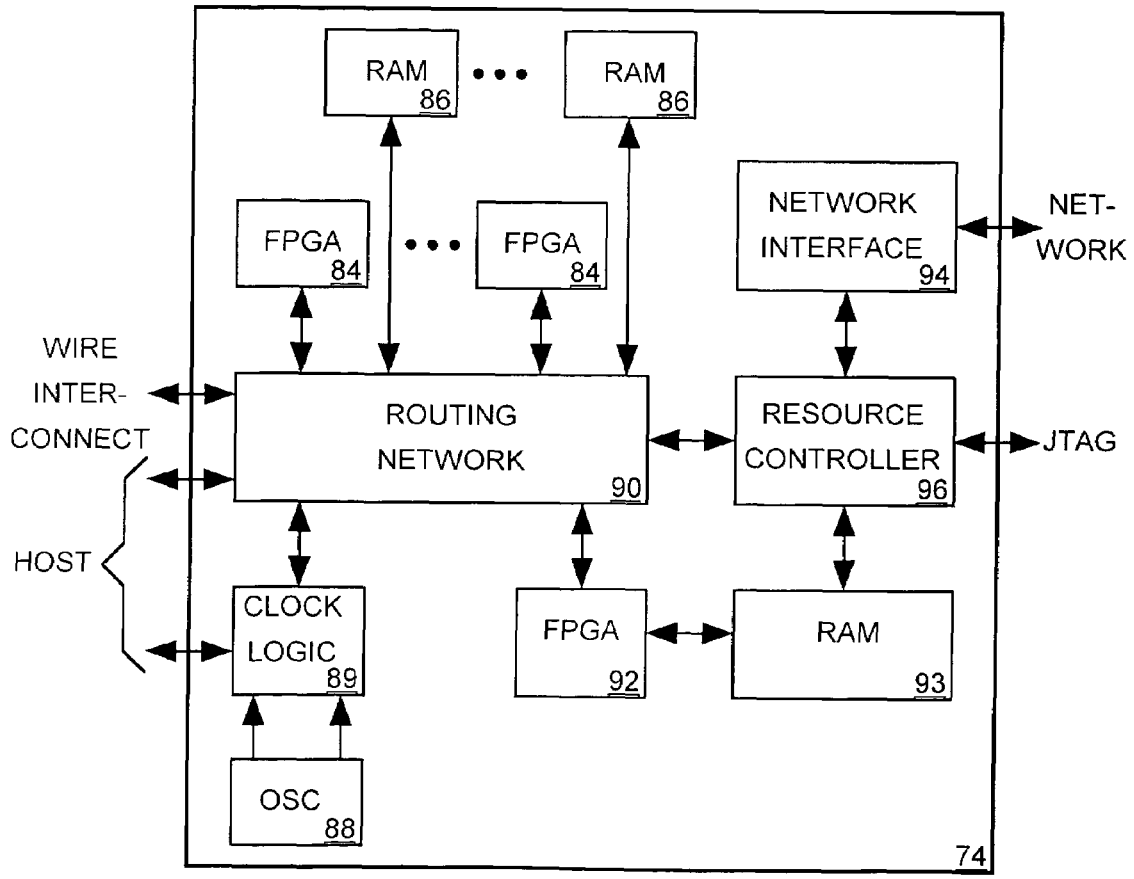
FIG. 7 illustrates a resource board of FIG. 6 in more detailed block diagram form.

FIG. 7 depicts an example of one of resource boards 74 of FIG. 6 in more detailed block diagram form. Resource board 74 includes a set of programmable logic devices (PLDs), in this example, field programmable gate arrays (FPGAs) 84 that can be used to emulate modules of a circuit being emulated. A set of random access memories (RAMs) 86 can be used, for example, to emulate circuit memory. Oscillators 88 supply periodic signals to a clock logic circuit 89 providing clock signals for FPGAs 84 using the oscillator output signals, or a clock signal from host system 80, as timing references. FPGAs 84 communicate with one another and read and write access RAMs 86 through a routing network 90 which may be switched to provide flexibility in signal routing between IO terminals of the various devices it interconnects. One or more other FPGAs 92 accessing a RAM 93 can, for example, be programmed to act as a pattern generator supplying test signal inputs to circuit modules emulated by FPGAs 84 or to act as a data acquisition system for monitoring and storing data representing states of output signals of FPGAs 86, The wire interconnects 79 and cables 82 of FIG. 6 link other resource boards and the host system 80 to routing network 90 so that the FPGAs 84 can directly communicate with FPGAs on other resource boards and with circuits within host system 80.

Workstation 72 of FIG. 6 programs the FPGAs 84 and 92 on resource board 74 by sending packets containing programming instructions over the network 78 of FIG. 6 to a network interface 94, which passes the programming instructions to a resource controller 96. Resource controller 96 then forwards the programming instructions to programming inputs of the FPGAs via routing network 90. Workstation 72 can send packets containing instructions of resource controller 96 for controlling switches within routing network 90 so that in turn control signal routing between the FPGAs 84 and 92 and RAMs 86. Workstation 72 can send packets containing data resource controller 96 writes into RAM 93, for example defining signal patterns to be generated by FPGA 92. Workstation 72 can also send packets requesting resource controller 96 to read data FPGA 92 writes to RAM 93 when FPGA 92 acquires and stores data in RAM 93 representing states of signals generated by FPGAs 84.

Figure 8:
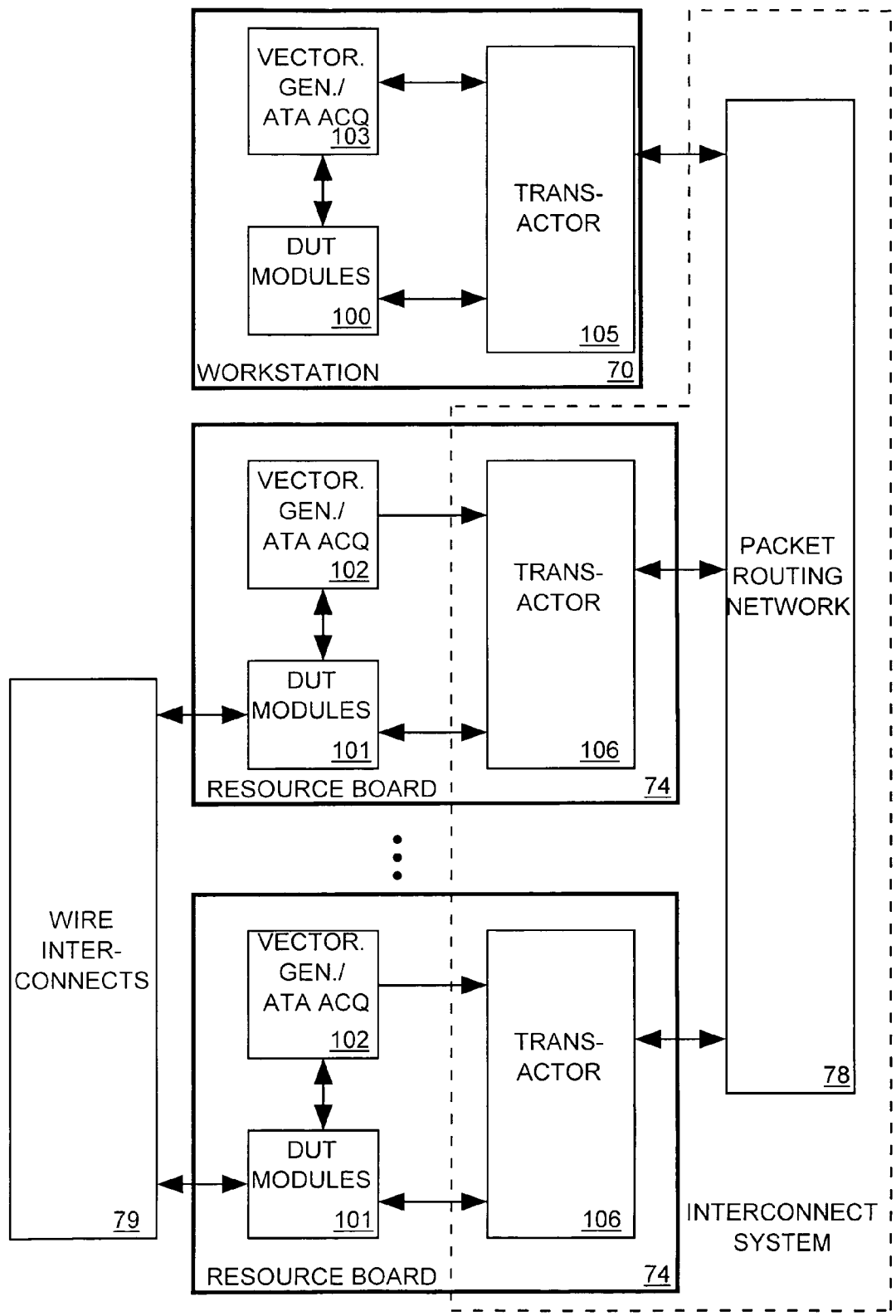
FIG. 8 is a data flow diagram illustrating communication paths between resources of the co-verification system of FIG. 6.

FIG. 8 is a data flow diagram illustrating how various parts of the co-verification system 70 of FIG. 6 communicate with one another when simulating and emulating portions of an electronic circuit device under test (DUT) described by a netlist. In a co-verification mode of operation, programs running on workstation 70 simulate one or more modules 100 of the DUT while PLDs, memories and other resources on resource boards 74 emulate other modules 101 of the DUT. Software on workstation 70 may also simulate some of the vector generation and data acquisition functions 103 described by a testbench, while resources on the resource boards 74 emulate other vector generation and data acquisition functions 102.

In addition to acting as a simulator for simulating DUT modules 100 and vector generation and data acquisition functions 103, workstation 70 also acts as a "transactor" 105 providing an interface between the packet routing network 76, DUT module simulation software 100 and vector generation and data acquisition software 103. Transactor 105 is implemented in part by software running on workstation 70 and in part by conventional network interface hardware controlled by that software. The resource controller 96 (FIG. 7) on each resource board 74 also implements a transactor 106 providing an interface between packet routing network 76 and the various resources on the resource board emulating DUT modules 101 and vector generation and data acquisition equipment 102.

Any transactor 105 or 106 may assemble and send a packet outward via packet routing network 76. Packet routing network 76 may forward the outgoing packet to all other transactors 105 and 106, or when it has network routing capability, network 76 may more selectively forward the outgoing packet based on a network destination address included in the packet. Each packet is arranged in accordance with the particular physical layer protocol the network uses, and will typically include payload data and a header containing information the network needs to route the packet. Each transactor 105 and 106 and each emulation resource on any resource board 74 has a unique network address, and the header included in each data packet transmitted via packet routing network 76 suitably indicates the network addresses of the devices designated as the source and destination of the packet. The header also includes a command telling the recipient transactor or workstation to carry out an action. The packet's payload data may be of fixed or variable length depending on the nature of the network's physical layer protocol, though variable length packets are preferable. The payload data includes any data to be used as an argument to the command included in the header. For example, if the command tells a receiving transactor 106 to drive input signals of a particular emulation resource the packet's destination address identifies to particular states, then the payload data will reference the signals and indicate the states to which they are to be driven. The transactor 106 will execute the command in an incoming packet only if the network destination address included in the packet header matches its own address or the address of any emulation resource residing on the local resource board 74.

The transactor 106 of each resource board 74 not only transmits and receives packets but also communicates with the local emulation resources, such as FPGAs and RAMs, on that resource board using communication protocols that are appropriate to those resources. Since the nature of transactions each transactor 106 carries out depends on what the local emulation resources are programmed to do, the resource controller 96 (FIG. 7) carrying out the function of transactor 106 is suitably implemented in part by one or more programmable logic devices that can be initially programmed, for example, by programming data supplied from an external source through a JTAG or other type of bus. The initial programming boots resource controller 96 so that it can receive further programming instructions conveyed by incoming packets addressed to transactor 106.

Packets can convey programming data for the emulation resources such as FPGAs mounted on resource boards 74. To program an FPGA, workstation 70 addresses a packet conveying a "download" command and FPGA programming data to the particular FPGA to be programmed. The transactor 106 on the resource board 74 containing the addressed FPGA is programmed to respond to the download command in the incoming packet by forwarding the packet's payload programming data to the programming input of the addressed FPGA.

During the co-simulation process, packet transmitted via network 76 may convey data indicating current states of resource output signals or indicating state to which resource input signals are to be driven. For example a "read" command in an incoming packet can tell a transactor 106 to return a signal data packet to the source address containing payload data indicating states of signals at various I/O terminals of an FPGA addressed by the incoming packet's destination address. A "force" command in a packet can tell a receiving transactor 106 to drive input terminals of an emulation resource addressed by the packet's destination address to states indicated data conveyed in the packet.

A sequence of packets containing force and read commands can emulate the behavior of signal paths between output terminals of the emulation resources on the resource board 74 sending the packets and input terminals of emulation resources 48 on another resource board to which the packets are addressed. In a co-validation mode of operation, workstation 70 (or any other computer that may be connected to packet routing network 76) can simulate some portions of an IC while emulation resources 48 on resource boards 44 emulate other portions of the IC. In that mode of operation, transactors 105 and 106 use packets conveying force and read commands to drive signal inputs to resources within various modules.

As discussed above, resource board 74 may include random access memory that can, for example, emulate the function of a memory bank. In such case, a write command conveyed in an incoming packet's header can tell the transactor 106 for that resource board to write data at a particular address or a block of addresses within one of the RAMs selected by the packet's destination address. The argument data included in the packet's data payload references the RAM address to be accessed and, in the case of a force command, contains the data to be written to that RAM address. A memory read command tells a transactor 106 to read data at a particular address or block of addresses of a RAM addressed by the destination address and to return the data read out of the RAM in a packet addressed to the device identified by the source address included in the incoming packet's header.

An FPGA or other type of PLD residing on a resource board can include internal registers, latches or other storage devices that are read and write accessible through its IO terminals. Read and write commands transactors 105 and 106 send and receive via packets addressed to those PLDs can also tell receiving transactors 106 to read and write access those storage devices.

Co-Verification System Programming

Figure 9:
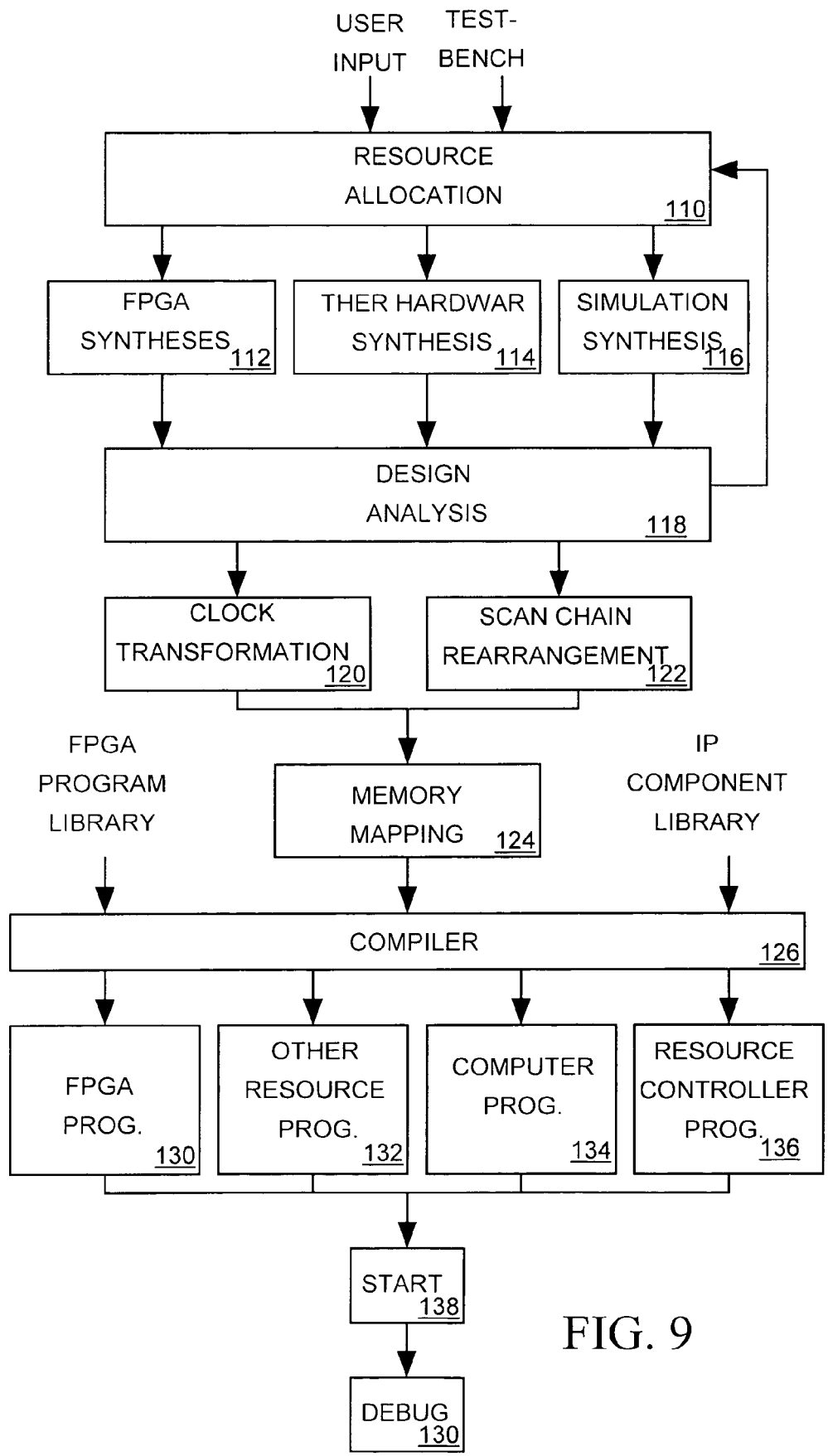
FIG. 9 is a data flow diagram illustrating a method for programming the co-verification system of FIG. 6 in accordance with the invention.

FIG. 9 is a flow diagram illustrating an example method for programming a co-verification system in accordance with the invention for verifying the behavior of an IC or portion of an IC described by a netlist. The method is suitably carried out by the workstation 72 (FIG. 6) or any other computer connected to network 78 reading and executing software residing on computer-readable media.

A circuit designer typically generates a conventional hardware description language (HDL) "testbench" including a netlist description of the IC device under test (DUT). The testbench includes the netlist description of a DUT and describes the time-varying behavior of test signals (vectors) to be applied to inputs of the DUT. The testbench also identifies various signals within the DUT that are to be monitored during the verification process.

The first step of the programming process is to allocate resources for simulating or emulating each module of the DUT and the various vector generation and data monitoring functions described by the testbench (step 110). The workstation bases resource allocation on the nature of the modules described by the netlist with guidance provided by user input. For example, FPGAs residing on resource boards may be allocated for emulating some DUT modules or test functions, other types of hardware resources such as RAMs residing on other resource boards or hardware pattern generation or data acquisition systems may be allocated for emulating other DUT modules or test functions. In a co-verification mode of operation, the workstation or other computers connected to the packet routing network may be allocated to simulate other DUT modules or test functions.

After allocating resources at step 110, the workstation processes the testbench to synthesize a separate netlist or testbench description of the portion of the testbench to be emulated or simulated by each resource. The workstation synthesizes separate testbenches for the FPGAs describing only the portions of the DUT and vector generation data acquisition test functions to which they have been allocated (step 112). Similarly the workstation synthesizes separate testbenches (steps 114) describing other DUT modules or test functions to be emulated by each other hardware emulation resource boards and synthesizes separate testbenches (step 116) for the simulation to be carried out by the workstation or any other computer that may included in the co-verification system.

The workstation then analyzes the design of the separate testbenches synthesized at steps 112, 114 and 116 to determine whether the resources allocated to emulate or simulate the DUT modules and test functions described by those testbenches are adequate for the task. If not, the workstation returns to the allocation step 110 to tell the user that it is necessary to reallocate resources.

When the workstation determines at step 118 that resource allocation is adequate, the workstation modifies the separate testbenches describing DUT modules to be emulated by hardware resources when necessary to transform the DUT's clock signal distribution system to a form that the hardware emulation resources can appropriately emulate (step 120). The nature of the clock transformation process carried out at step 120 is described in more detail below.

The workstation also modifies the testbenches synthesized for the FPGAs at step 112 to rearrange any scan chains that may be incorporated into the DUT design when necessary to accommodate the manner in which DUT emulation has been partitioned between FPGAs (step 122). The scan chain rearrangement step 122 is also described in more detail below.

The workstation then (step 124) memory maps the IO signals of all DUT modules, all DUT random access or read only memory addresses, and all DUT data storage devices (such as for example registers and latches) to a common memory space such that each DUT signal, memory address and data storage device is assigned a separate address within that memory space. The purpose of this memory mapping step is described in detail below.

Figure 4:
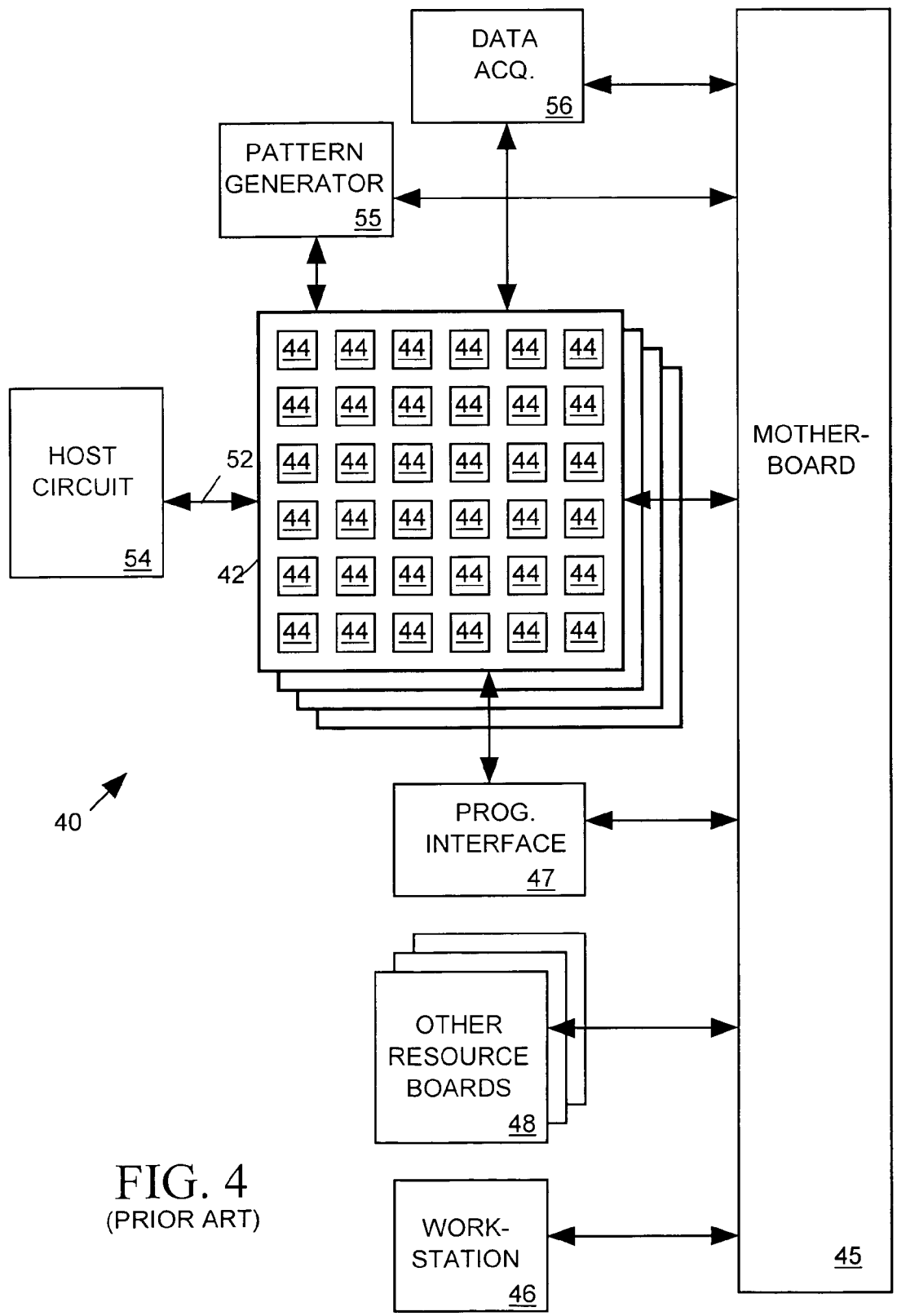
FIG. 4 illustrates a prior art co-verification system in block diagram form

The separate testbenches for the programmable emulation and simulation resources are then provided as input to a compiler (step 126), which converts them into resource programs, including programs for the FPGAs and other resources and programs to be run by the workstation itself or other computers. Programs for the workstation enable the workstation to act as a simulator, simulating the behavior of various modules of the DUT in response to input signals and generating data representing behavior of DUT signal. The compiler may compile simulation programs for other computers that may be included in the co-validation system. For FPGAs, the compiler consults an FPGA program library the FPGA manufacturer provides to produce FPGA programs for emulating the various logic gate arrangements the testbench describes. For FPGAs, the compiler consults an FPGA program library the FPGA manufacturer provides to produce FPGA programs for emulating the various logic gate arrangements the testbench describes. The compiler also generates programs for resource controllers 56 on each resource board 74 (FIG. 4) to enable them to appropriately configure the routing network 90 and clock logic circuit 89 resource board, and generates programs for the workstation and the resource controllers enabling them to implement transactors providing virtual signal paths and other types of communication between the portions of the testbench simulated by the workstation or other computers and portions of the testbench emulated by the emulation resources.

The workstation loads compiled programs into all of the FPGAs (step 130) and other resources to be employed in the emulation (step 132) by sending packets containing programming data to the transactors of the resource boards containing the resources to be programmed. The workstation also forwards programs it may have compiled for other computers to those computers via the network (step 134). At step 136, the workstation forwards programming data for the resource controller 56 (FIG. 4) of each resource board 74. Each resource controller 56 may, for example, write some of the control data into control registers for controlling routing 42 between resources on the resource board and may write other data into RAM 93 describing the test vector patterns generated by FPGA 91.

After programming all resources, workstation 70 starts the emulation process (step 138), for example by sending packets signaling transactors to reset the emulated DUT to an initial state and to begin supplying test signal inputs to emulation resources and to begin processing resource output signals. When emulation process ends, the workstation initiates a debugging process (step 139) in which it retrieves and analyzes probe data collected in the RAMs 93 of each resource board during the emulation process.

Hierarchical Resource Allocation

In the resource allocation step 110 of FIG. 9, the workstation allocates various co-validation system resources for simulating or emulating each portion of the electronic circuit described by the netlist included in the testbench, and also allocates resources for carrying out the vector generation and data acquisition functions described in the testbench. A netlist typically describes a circuit as comprising a set of individual cells interconnected to form small, low-level circuit modules, with low-level modules being interconnected to form larger, higher level modules. Thus the design of an IC is often a multiple level hierarchy of modules. The number of signal paths between at any given level of the design hierarchy tends to decrease rapidly with increasing hierarchical level. Since cells forming modules at the lowest level of the design hierarchy tend to be highly interconnected a great many signal paths normally reside within each low level module. While a large number of signal paths can interconnect low-level modules forming a next higher-level module, there are normally substantially fewer such module-to-module signal paths than are found inside each module. Relatively few signal paths normally interconnect modules at the highest level of the design hierarchy. For example when an integrated circuit includes an embedded processor, a memory and one or more other modules at the highest level of its design hierarchy, each high level module may include millions of internal signal paths, but the high level modules communicate with each other through a parallel bus including only a few signal paths.

The workstation can allocate co-validation system resources in a way that mimics the hierarchical nature of a typical DUT design. For example, since logic gates within individual FPGAs are highly interconnected, individual FPGAs can be used to emulate gates residing at the lowest level of the design hierarchy. The workstation can allocate FPGAs residing on the same resource board for emulating groups of lower level modules forming the same higher-level modules, because the routing network 90 of each resource board 74 (FIG. 7) provides a relatively large number of high-speed signal paths between FPGAs 84 and RAMs 86. The workstation and separate resource boards can be used to simulate and emulate different modules at the highest level of the design hierarchy, and they can communicate with one another through virtual signal paths. Although network 78 (FIG. 6) can provide a very large number of virtual signals paths between resource boards 74 and the workstation 72, the limited bandwidth of the network places a practical limit on the number and bandwidth of such virtual paths and can limit the clock frequency of the emulation process. However since there are normally relatively few signal paths between modules residing at the highest levels of the design hierarchy, it is helpful to partition the design between resource boards at the highest levels of the design hierarchy. Where necessary, bus switching and routing arrangements within the packet routing network 78 can be arranged to organize resource boards into higher-level groupings to provide increased bandwidth between resource boards Thus when allocating resources for emulating or simulating the various parts of a DUT a step 110, it is helpful to allocate resources along hierarchical lines to match the inter-module communication bandwidth requirements at each level of the hierarchical DUT design to the communication bandwidth capability of each level of the hierarchical emulation system.

System on Chip Emulation

Figure 10:
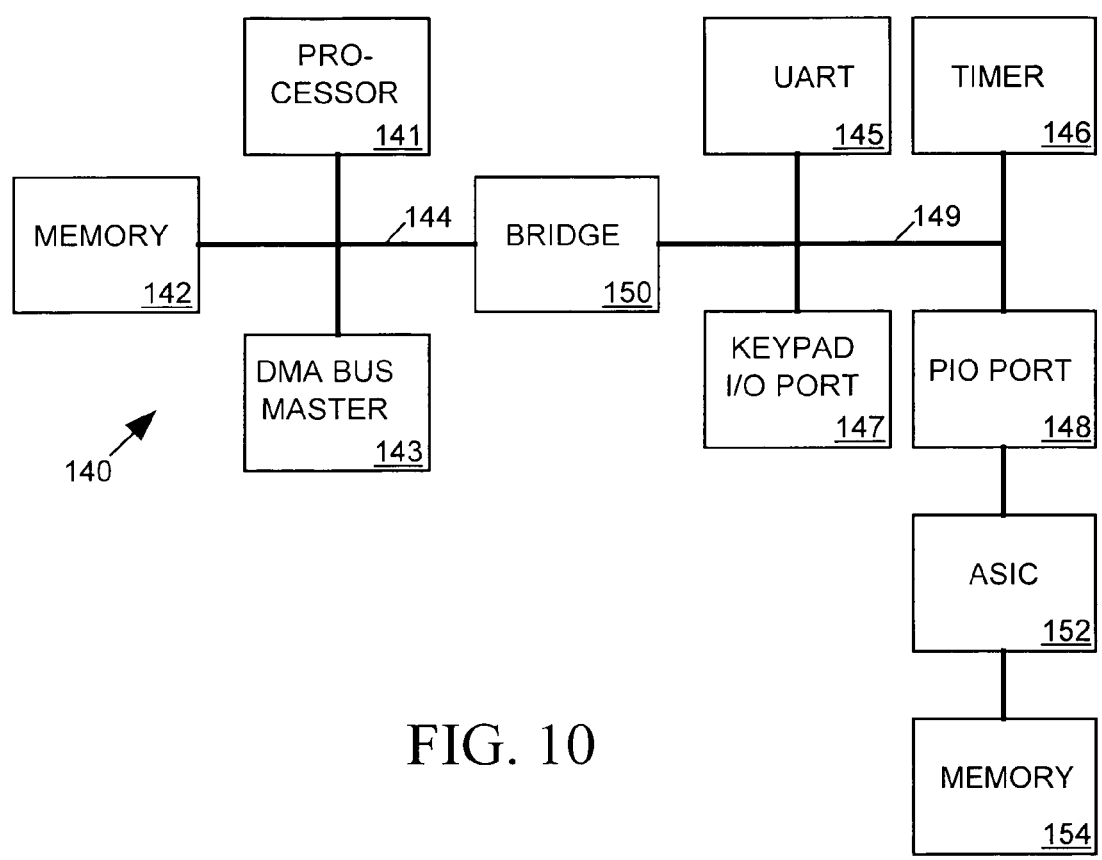
FIG. 10 depicts a system-on-chip IC in block diagram form.

A co-validation system is particularly suitable for emulating "System-On-Chip" (SoC) integrated circuits that may include embedded processors, memories and other large, standardized intellectual property (IP) components. FIG. 10 depicts the components of a typical SoC IC 140 including a standard processor 141 a standard memory 142, and various other components including a DMA bus master 143, a computer bus 144, a UART 145, a timer 146, a keypad I/O port 147 and a PIO port 148, a peripheral bus 149, and a bridge 150 linking buses 144 and 149. An IC may also include, for example, an application specific integrated circuit (ASIC) 152 and a memory 154 accessed by the ASIC.

When processing a testbench including a description of SoC 140, the workstation 72 determines at step 110 (FIG. 6) the nature of the various modules of the SoC DUT and other portions of the testbench to be verified and then allocates available emulation resources for verifying each component. Since the IP component designers will have already tested the functionality of IP components such as processor 141 and memory 142 that may be included in SoC 140, a system for emulating SoC 140 employing an IP component need only simulate or emulate the behavior of those IP components at a relatively high level of abstraction, a task which for a suitably programmed workstation is well-suited. IP component suppliers can provide programs in component libraries for simulating the behavior of their IP components that the workstation can employ during the compilation step 125. On the other hand, the designer may prefer the workstation to allocate FPGAs to emulate custom designed modules of the SoC, such as ASIC 152, at a lower level of abstraction to permit the designer to more thoroughly debug the design of such components.

Figure 5:
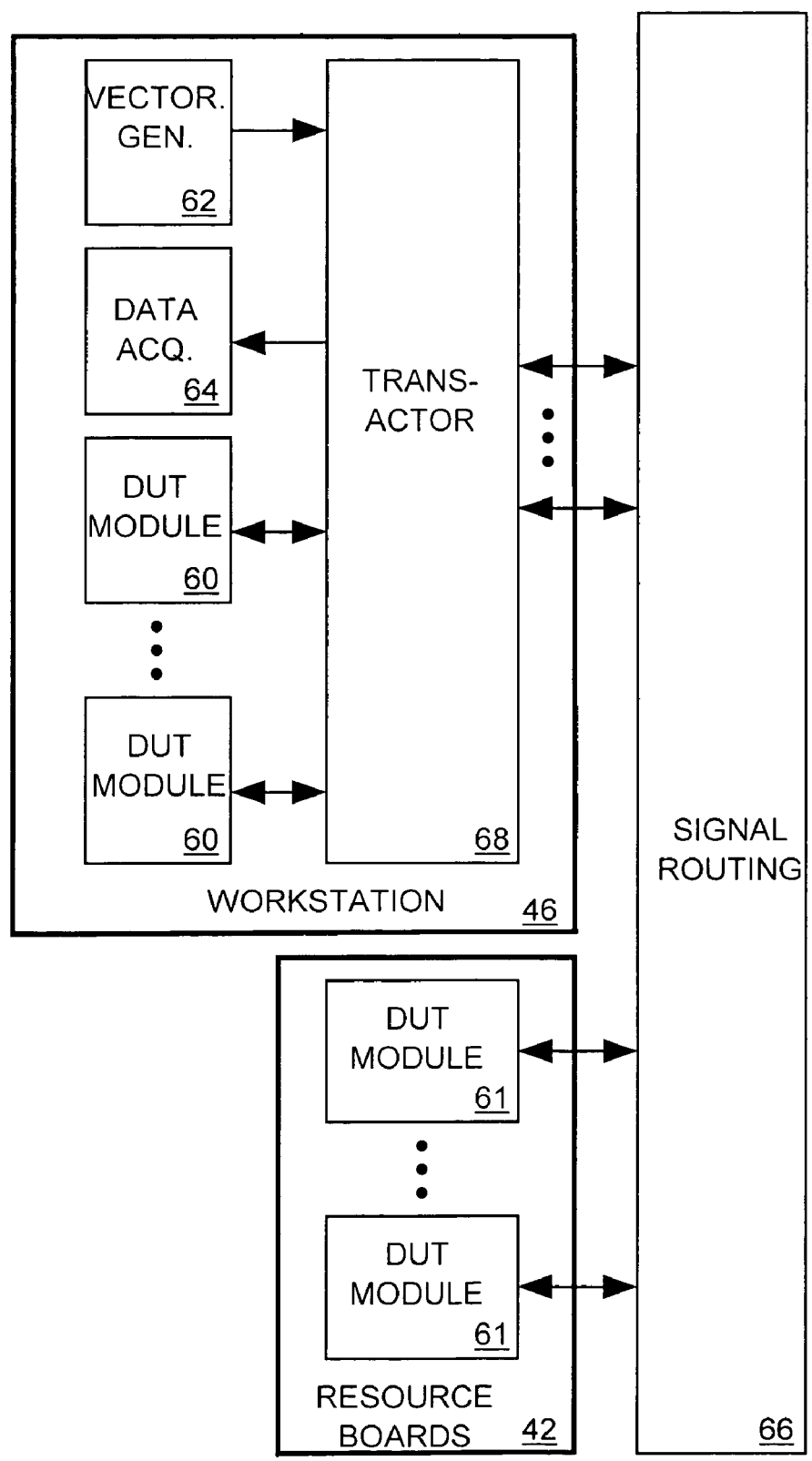
FIG. 5 is a data flow diagram illustrating communication paths between resources of the co-verification system of FIG. 4.
Figure 11:
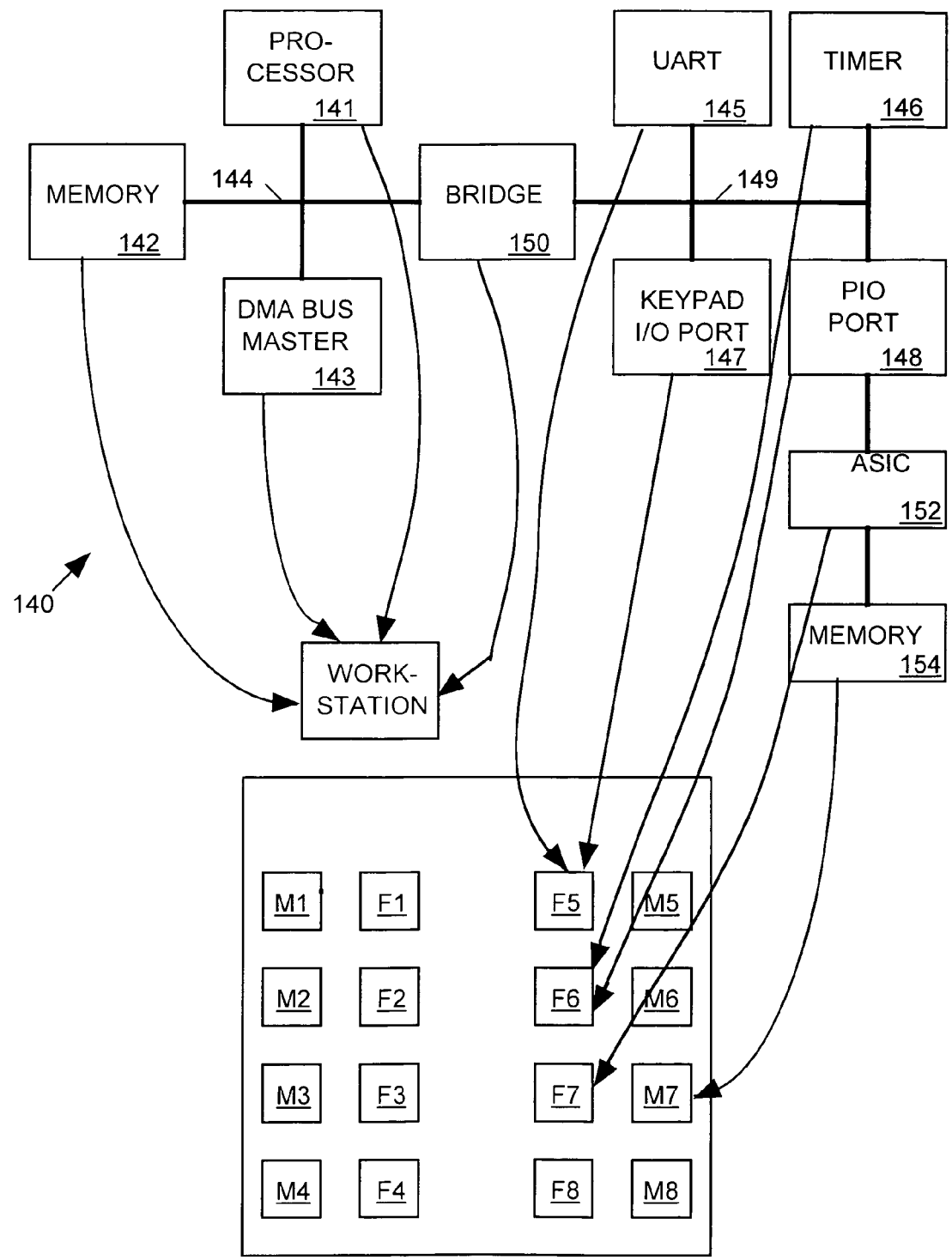
FIG. 11 depicts an example display produced by a workstation while implementing a resource allocation step of the method of FIG. 9

Upon allocating the verification resources to the various modules of the design at step 110 based on an analysis of the testbench, workstation 70 displays a block diagram depicting the various components of the testbench to be verified at a user-specified level of the design hierarchy. The display also depicts the available emulation resources at that hierarchical level and shows how they have been allocated. For example FIG. 11 shows a high level display the workstation would produce when allocating emulation resources to SoC 140 of FIG. 5. The display includes blocks representing major components of SoC 140 and blocks representing available emulation resources, including in this example the workstation and a single FPGA resource board including a set of eight FPGAs F1-F8 and a set of eight RAMs M1-M8. The display graphically depicts how emulation resources are allocated by displaying an arrow extending from each block representing a DUT component to a block representing the resource to be used to emulate it. The designer can modify a resource allocation by using a mouse to drag the head of an arrow from one resource to another; however the resource allocation software will notify the user when the emulation resource the user selects to emulate an IC module is not of an appropriate type or capacity for emulating that resource.

In this example the workstation has been allocated for simulating the behavior of processor 141, memory 142, bus master 142 and bridge 150. FPGA F5 emulates UART 145 and keyboard IO port 147, FPGA F6 emulates timer 146 and PIO port 148, FPGA F7 emulates ASIC 152 and RAM M7 emulates memory 154. In this case, the transactors will employ virtual signal paths and the routing network on the resource board to emulate the bus 149 connecting bridge 150 (simulated by the workstation) with the devices 146-148 emulated by FPGAs F5 and F6, Clock Transformation Like the DUT it verifies, the co-validation system employs various clock signals to coordinate the timing of various logic components. When a clock signal clocks two or more components, each edge of that clock signal should arrive at each component with little time difference ("skew"). The clock analysis and logic transformation step 120 of FIG. 9 identifies and eliminates clock skew problems that can arise when separate portions of an IC are emulated by separate PLDs.

Figure 12:
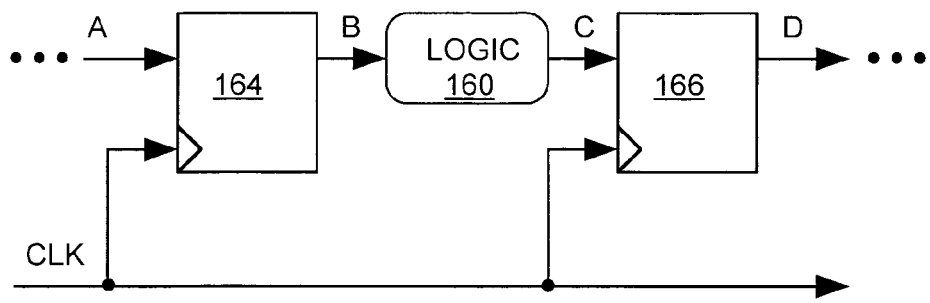
FIGS. 12-14 are block diagrams illustrating various clock routing circuits.

For example as illustrated in FIG. 12, an FPGA can implement synchronous register transfer logic in which inputs and outputs of a block of logic 160 are linked through latches 164 and 166 clocked by a system clock signal CLK. In an FPGA the system clock signal is delivered to latches 164 and 166 though one of a set of dedicated clock buses, and each clock bus is designed to convey the system clock signal from one the FPGA's I/O terminals to all latches the FPGA that are to be clocked by it with very little clock signal skew.

Figure 13:
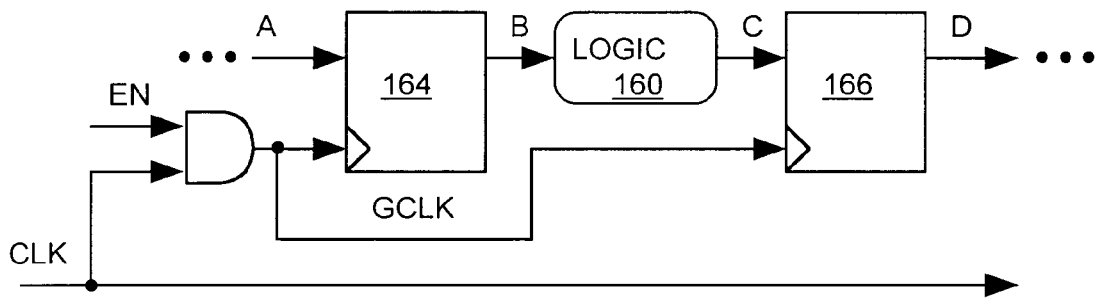
Figure 14:
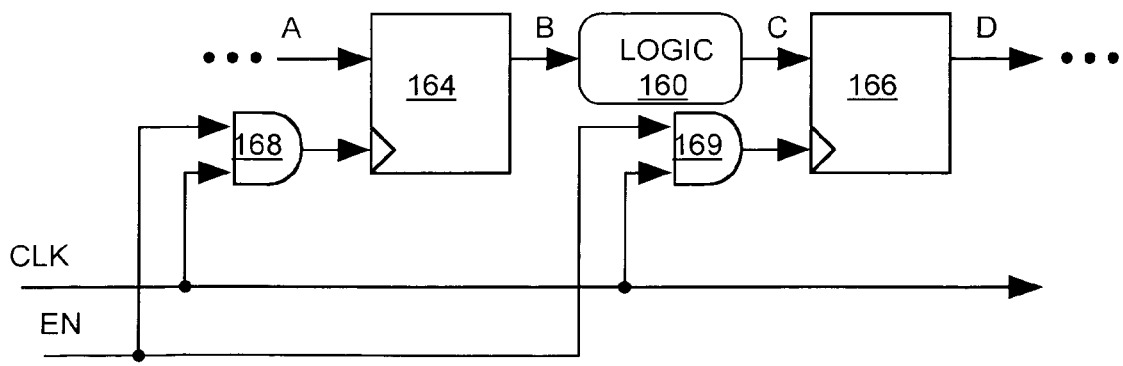

However a gated clock signal system as illustrated in FIG. 13 can be problematic for an emulator. Latches 164 and 166 are clocked by a clock signal GCLK gated by an AND gate 168 in response to an enable signal EN and a system clock signal CLK. When gate 168 is closer to latch 164 than latch 166, logic errors can arise if the output C of logic block 162 changes state in response to a GCLK signal edge arriving at latch 164 before the GCLK signal edge arrives at latch 166. When a placement and routing tool generates a layout for an IC containing a gated clock signal, timing analysis software analyzes the layout to identify clock signal skew and inserts buffers in the clock signal path as necessary to adjust delays through selected branches of the clock signal path to eliminate these kind of skew problems. When separate FPGAs emulate separate portions of the circuit of FIG. 13, inserting buffers in appropriate branches of the GCLK signal path clock cannot readily eliminate clock skew. But revising the logic so that no gated clock signal clocks more than one latch can eliminate clock skew. For example the logic of FIG. 13 can be revised as shown in FIG. 14 to provide two AND gates 168 and 169 instead of one, each separately gating CLK signal to produce a gated clock signal for a corresponding one of latches 164 and 166. The CLK signal is routed to both AND gates 168 and 169 via one of the FPGA's clock buses so it exhibits very little skew, and the symmetric path delays similar devices emulating gates 168 and 169 provide ensure that latches 164 and 166 are clocked with little skew. U.S. patent application Ser. No. 10/735,341, filed Feb. 11, 2003, incorporated herein by reference, describes the clock transformation step 120 of FIG. 9 in detail.

Scan Chain Re-Arrangement (Step 122)

Figure 15:
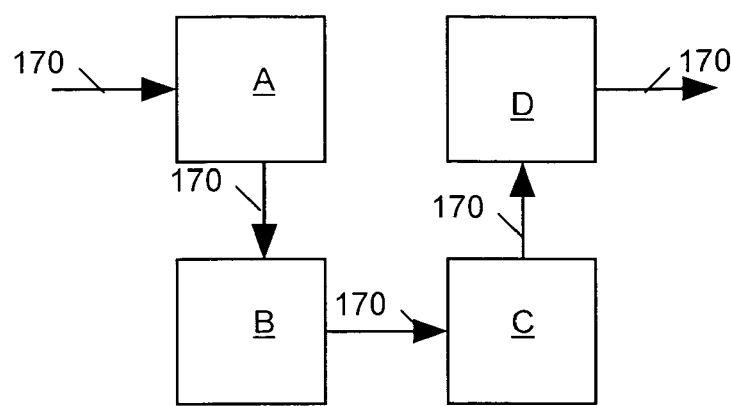
FIGS. 15-17 are block diagrams illustrating various scan chain arrangements.

The scan chain re-arrangement step 122 of the method of FIG. 9 modifies the DUT design as necessary to reduce the number of signal paths between resource boards needed to implement a scan chain. As illustrated in FIG. 15, a DUT may include a scan bus 170 linking a set of shift registers ("scan registers") implemented within of modules A-D in series. Scan bus 170 may include, for example, a data line connected from register-to-register for conveying a clock line for clocking the data through the registers, and one or more control lines for telling the circuits containing the scan registers when to read data in or write data to the scan registers. A scan bus allows an external circuit to shift large amounts of data into and out various modules of the DUT without having to use very many of the DUT's I/O terminals.

Figure 16:
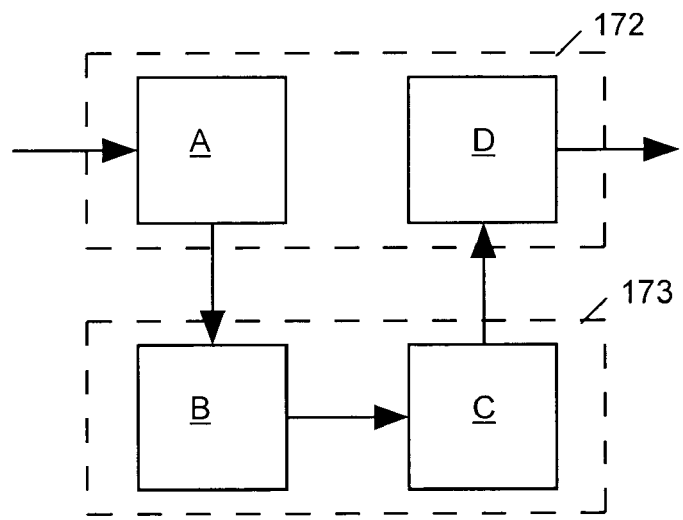
Figure 17:
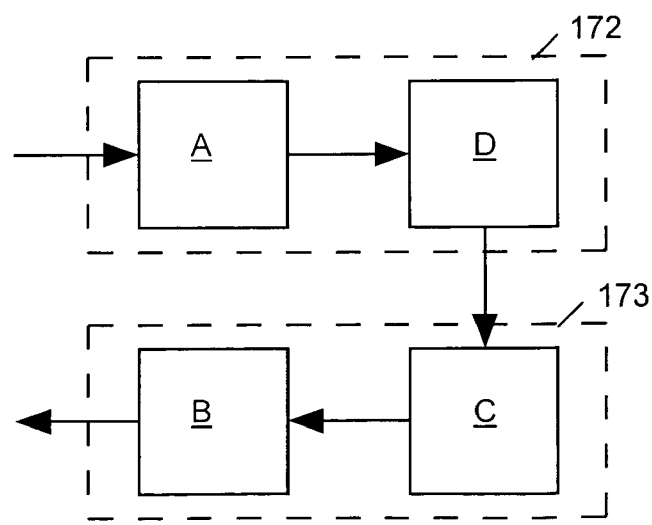

When an emulated DUT contains a scan bus, not all of the emulation resources emulating the various modules of the DUT may reside on the same resource board. For example, as illustrated in FIG. 16 FPGAs on one resource board 172 may emulate modules A and D while FPGAs on another resource board 173 may emulate modules B and C. With this allocation, the scan bus requires two virtual paths between the two resource boards 172 and 173, one providing the A-to-B path and the other providing the C-to-D path. Packet traffic between the two resource boards would emulate these paths. Rerouting the scan bus to follow the route A-D-C-B as illustrated in FIG. 17, rather than the route A-B-C-D as illustrated in FIG. 16 can reduce the number of virtual signal paths between the two resource boards to one. Thus to reduce the number of scan bus paths between modules, workstation 70, at step 122 of FIG. 9, studies the emulation resource allocation plan it developed at step 110 and rearranges the module-to-module scan bus routing when doing so can reduce the number of scan data paths between separate emulation resources. The workstation also appropriately re-arranges the test vectors the testbench describes that shift data in and out of the scan chain to accommodate the scan chain re-arrangement.

Memory Mapping

Mapping all of the signals and storage devices such as registers, latches and memory addresses of the DUT to a common address space at step 124 FIG. 6) makes it easier to program the co-validations system and reduces the time needed to recompile programs following a change to the testbench or a change in the allocation of system resources at step 110.

When workstation software simulating a DUT module or a pattern generator needs to drive a signal on any resource board to a particular state or to write data to a memory mapped storage device within any resource board, it executes a memory write instruction such as:

write location1 data1.

This instruction indicates that data (data1) is to be written to a memory address (location1). All of the resources are also mapped to network addresses, and the workstation transactor responds to the instruction by sending a packet addressed to the resource containing the signal or storage device. The packet contains a write command and data indicating the particular signal and the state to which it is to be driven or referencing the particular resource storage location and indicating the data to be written to that storage location. The resource board transactor then carries out the command included in the packet by driving the resource signal to the indicated state or by writing the appropriate data to the indicated resource storage location.

When workstation software emulating a portion of DUT 36 or performing testbench data acquisition functions wants to learn the state of a memory mapped signal generated by one of the emulation resources or to read the contents of one of its memory mapped storage devices, it executes a read instruction such as:

read location2

This instruction indicates that data is to be read to memory address (location2) mapped to the resource output or storage location. The workstation transactor responds to the instruction by sending a packet addressed to the appropriate resource containing a read command and data referencing the particular resource signal or storage device to be read accessed. The transactor on the resource board then carries out the read command included in the packet by determining the state of the resource signal or by reading the contents of the resource storage location and then returning the data it obtains to the workstation transactor via a packet. The workstation transactor then returns the data included in the packet to the software in response to the memory read instruction.

Software running on other computers connected to network 78 of FIG. 6 to simulate portions of a test bench can execute memory read and write instructions to interact with local or remote resources in a similar manner. The transactors handle all of the low-level activities needed to carry out the interaction.

The memory read/write communication protocol simplifies the process of developing software for simulating components of the DUT or pattern generation and data acquisition functions because the software need not need not handle low-level aspects of the communication between emulation resources, and because all software-driven resources communicate with hardware resources in the same way, simply by read and write accessing memory address.

Memory mapping renders the equipment simulating or emulating any DUT module transparent to software running or the workstation or computer simulating any other DUT module or any test function. This allows a designer to change the allocation of co-validation resources with respect to any one DUT module without having to change or recompile the programming of any resources allocated to any other DUT module. For example, suppose the workstation initially simulates two DUT modules A and B, and the software components that implement the two modules communicate with each other using memory read and write instructions. Thereafter the designer completes a detailed design of module B and wants to use an FPGA on a resource board to emulate module B. While it is necessary for the workstation to compile a new program for the FPGA that is to emulate module B, and to update the memory maps accessed by the transactors to account for the change, it is not necessary for the workstation to recompile the software simulating module A, since memory mapping makes the change transparent to that software. Since the time required to compile programs for the various components of the co-validation system can be a significant portion of the time required to carry out the co-validation process, memory mapping system resources helps to reduce processing time following a change in resource allocation but minimizing the portion of system programming the workstation must recompile.

Debugging

The purpose of the co-validation process is to collect and analyze probe data at step 130 of FIG. 9 representing the time varying behavior of various signals that the devices simulating and emulating modules of the DUT produce in response to test signals applied to their inputs. Debugging software running on the workstation helps a designer analyze the probe data collected during the emulation process to determine whether the emulated DUT behaved as expected and if not, to determine what may be wrong with the DUT design. The workstation can program the FPGA 92 on each resource board to acquire probe data representing signal states during the co-validation process and store that data in local RAM 92. Thereafter, debugging software running on the workstation can read and analyze the probe data stored in RAM 93. Storing the probe data in RAM 92, rather than continually forwarding it to the workstation during the emulation processes, helps to reduce packet traffic on the network and can enable the emulation to proceed at higher frequencies.

An emulator in accordance with the invention may operate in a "full vision" mode wherein the FPGA 92 in each resource board 71 acquires probe data for all monitored DUT signals during each system clock cycle in which a DUT signal may change state. The full vision mode enables the debug software running on workstation 72 to later debug emulator operation on a cycle-by-cycle basis. But since RAM 93 is of a limited size, it may not be possible for it to store all of the probe data acquired during a full-vision mode emulation. Thus when the amount of probe data collected is too large to store in the local RAM 90 until the end of the emulation process, the transactor for the local resource board must forward blocks of probe data from the local RAM 93 to the workstation via packets during emulation process so that the workstation can store it, for example, on a hard disk. Due to bandwidth limitations on the network it may be necessary to greatly reduce the frequency of the system clock controlling the rate of state changes in the DUT output signals to limit the rate at which the resource board must acquire and forward probe data via packets to the workstation. Alternatively it may be necessary to halt the emulation process while probe data is being forwarded to the workstation. Thus the full vision mode of operation can greatly slow the emulation process, particularly when many DUT signals are being monitored and a large amount of probe data is being acquired. This can be problematic, particularly for in-circuit emulations where real-time emulation is necessary.

Cycle-Driven Variable Resolution Debugging Mode

Figure 1:
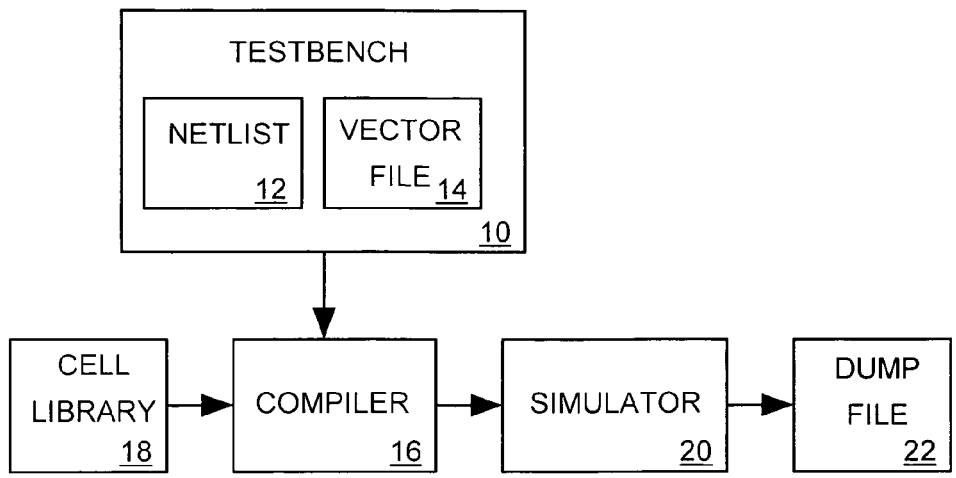
FIG. 1 is a process flow diagram illustrating a prior art simulation system.
Figure 2:
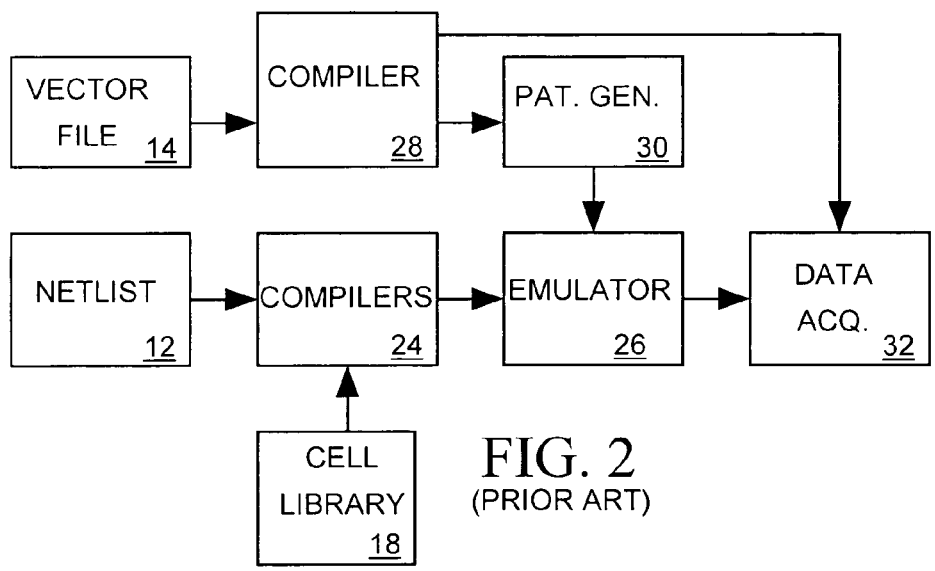
FIG. 2 is a process flow diagram illustrating a prior art emulation system.
Figure 3:
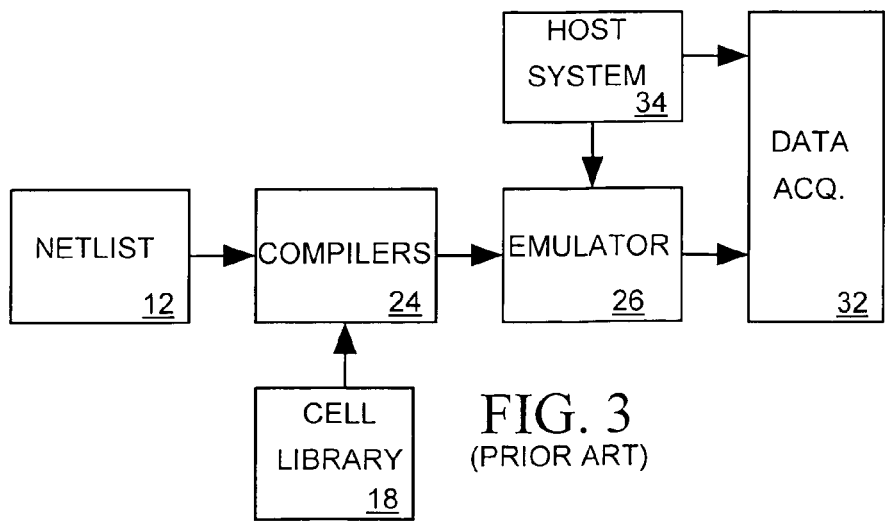
FIG. 3 is a process flow diagram illustrating a prior art in-circuit emulation system.

Operating the co-validation system in a "variable-resolution debugging mode" can alternatively solve the probe data overload problem associated with full vision mode operation. In that debugging mode, the FPGA 992 of each resource board (FIG. 3) collects probe data at a frequency lower that that of the system clock signal so that they acquire probe data representing the state of each monitored DUT signal only once every N cycles of the system clock signal, where N is initially be a large number (e.g. 1,000,000). Thus when operating in the variable resolution mode, FPGA 92 acquires only 1/Nth as much probe data during the emulation process as it would acquire when operating in the normal resolution mode. The probe data stored in FPGA 92 at the end of the emulation process forms only a "low resolution" picture of each monitored DUT signal in that it depicts the signal state on only every $N^{th}$ system clock cycle.

After using debugging software to review the low resolution probe data, the IC designer might like to have a higher resolution picture view of the DUT signals (e.g. N=1000 instead of 1,000,000) during some portion of the emulation process sufficiently short that the probe data collected will not overload RAM 93. The designer then commands the emulation system to repeat that particular period of the emulation process with the N set to 1000 instead of 1,000,000. At the end of the process the designer can use debugging software to analyze the higher resolution probe data for that period of the emulation. Should the designer thereafter wish to look at probe data with "full-vision" resolution (e.g. N=1) for a very short portion of the emulation process, the designer can command the emulation system to repeat that very short portion of the emulation process with the N set to 1.

In order to repeat the emulation process during some short period of interest, the co-validation system must be able to set the emulation resources to the states they had at the start of that period of interest. One way to do that is to restart the emulation process from the beginning with the probe data collection initially being suppressed so that no probe data is collected until the emulation process reaches the period of interest. The FPGA 92 in each resource board then begins writing probe data to RAM 93 at the start of the period of interest with N set to the appropriate value, and then stops the emulation process at the end of the period of interest. However this approach can be time-consuming when the period of interest occurs late in the emulation process.

Another way to reset the co-validation process to a state it had at the start of some period of interest during a previous emulation process is to drive it directly to that state. For example, the collective states the output signals of all storage devices within the FPGA that are clocked by the clock signal characterize the "state" of an FPGA or similar programmable logic device following any edge of a signal that clocks its internal logic. Many FPGAs can respond to a "read" command by generating a data sequence on an output "probe bus" indicating the states of every internal storage device output signal, and can respond to a "write" command by setting the output signals of all of its internal clocked device to states indicated by a data sequence supplied via the probe bus. Thus when operating in the variable debugging mode, local resource controller 96 can respond to block read commands in an incoming packet from workstation 72 by signaling the FPGAs 84 to read out the contents of their internal registers, and by writing that data to RAM 93. That block of data therefore acts as a "snapshot" of the state of the FPGAs. When the workstation initiates a block write operation at several points during the emulation process for each FPGA F1-F8 involved in the emulation process, then at the end of the emulation process, RAM 93 will store several sets of snapshot data, each representing the state FPGAs at separate times during the emulation process.

Thereafter, during the debugging process, when a designer determines that it would be helpful to redo the emulation process starting at a point of interest during the emulation at which a particular snapshot stored in RAM 93 was acquired, the workstation 72 commands the transactor on the each resource board to read the snapshot data corresponding to the starting point of interest from RAM 93 and to write that snapshot data back into FPGAs 34 to return them to the states they had when the snapshot data was initially required. The workstation also sends control data to the local transactor telling it to configure FPGA 92 to acquire probe data more frequently. The co-validation process then begins again at the point of interest.

To make use of this "state restoration" approach, the system must set all emulation resources, not just FPGAs, to their appropriate states at the start of the emulation period of interest. Thus it may be necessary for the emulation system to also save state data indicating the states of other resources employed during the emulation process whenever it saves FPGA state data. For example, when a memory emulates a portion of a DUT, the emulator can save the current contents of the memory on the workstation hard disk so that it can write it back into the memory before repeating the emulation period of interest. When software running on the workstation emulates a portion of the DUT, the software should save any data it needs to restore its current state of its program execution. The state restoration approach is therefore suitable, when FPGAs and other devices for which current operating states can be saved and restored emulate all portions of a DUT, but is not suitable when devices for which state data cannot be quickly and conveniently saved or which cannot be restored to states defined by such data emulate portions of the DUT.

Event-Driven Variable Debugging Mode

In an "event-driven" variable debugging mode, the FPGA 92 running on a resource board 71 monitors resource outputs and signals resource controller 96 to transmit an interrupt command in an outgoing packet when FPGA 92 detects a triggering event. A triggering event leading to an interrupt could be, for example, an assertion or a pattern of assertions of a particular DUT output signal or the appearance of a particular pattern in a set of DUT output signals. FPGA 92 can be programmed to maintain a count of the number of test cycles that have occurred and to respond to triggering events only during certain test cycles.

The interrupt causes the workstation to execute an interrupt routine telling it to signal local controller 96 to temporarily halt the system clock(s) controlling DUT logic operations and to initiate a snapshot operation wherein it saves data representing the current state of emulation resources in RAM 93 and to also save data indicating the current test cycle count. The workstation can also forward packets propagating the interrupt to transactors of other resource boards commanding them to also store snapshot data. After the snapshot data is saved, the system clock is restarted to resume the emulation process. The interrupt debugging mode thus allows snapshots to be collected in response to triggering events occurring during the emulation rather than periodically as in the cycle-driven variable resolution mode.

Parallel Simulation

As illustrated in FIG. 12, each logic block 160 of a synchronous logic circuit receives its input signals and transmits its output signals through clocked memory elements 164 and 166 such as latches or flip-flops. An FPGA typically uses flip-flops to emulate the memory elements 164 and 165 and uses a small memory acting as a lookup table to emulate logic block 160. Since the circuit being emulated employs a set of logic gates to implement logic block 160, the logic block 160 will include internal signals that the logic gates use to communicate with one another. However, since an FPGA uses a lookup table to emulate the logic of logic block 160, the FPGA does not directly emulate the logic block's internal signals. Thus the internal signals of logic block 160 are not directly observable during emulation, although the signals at the outputs of memory elements 164 and 166 are observerable and the emulator can store snapshot data representing their states and make that data available to the workstation. Since during any given clock cycle the internal states of signals within logic block 160 are logical combinations of the states of its inputs signals B, the workstation can determine the states of those internal signals during any clock cycle by reading snapshot data representing the states of input signals B and computing the states of the internal signals, based on formulas or lookup tables derived from the netlist description of logic block 160. See U.S. Pat. No. 5,999,725 issued Dec. 7, 1999 to Barbier et al for a description of this process.

One difficulty with that approach is that when the user wants to know the behavior of internal signals of logic block 64 during many successive clock cycles, the emulator must stop the emulation after each clock cycle, acquire the snapshot data for that clock cycle and forward it to the workstation. This can greatly reduce the speed of the emulation. In accordance with one aspect of the invention, a better approach requires the emulator to acquire and send snapshot data to the workstation only once, at the start of the succession of clock cycles for which the internal signal states are to be determined. That snapshot data defines the current state of the circuit being emulated at the start period of interest. The workstation is then programmed to simulate all portions of the circuit during the period of interest, including the portions that are also being emulated. The signals states in the simulated circuit's memory elements are initially preset to match the signal states indicated by the snapshot data to that the simulator will begin simulating the full circuit with the circuit's internal signals set to their appropriate initial states at the start of the period of interest. Since the simulator simulates the internal logic of logic block 160, it will be able to determine the states of the block's internal signals during all clock cycles of the subsequent period of interest. Although the simulator will require more time than the emulator to mimic the behavior of the circuit during the period of interest, it can carry out the simulation without any further disruption to the emulation process, since the simulator does not require the emulator to stop and send snapshot data to the simulator after each clock cycle during the period of interest.

When several computers are connected to network 78 (FIG. 6) and are available for carrying out simulations, they can share the task of simulating circuit behavior during a long period of interest that would require too much processing time for a single computer. For example, suppose the user wants to observe the behavior of internal signals of a logic block during clock cycles during clock cycles 10,000-10,299 and has three computers connected to network 78. The emulator is programmed to take a snapshot at each of clock cycles 10,000, 10,100, and 10,200 and to send the first snapshot data to computer 1, the second snapshot to computer 2, and the third snapshot to computer 3. Computer 1 then simulates circuit behavior for cycles 10,000 through 10,099, computer 2 simulates circuit behavior for cycles 10,100-10,199, and computer 3 simulates circuit behavior for cycles 10,200-10299. While computers 1-3 work in parallel to simulate circuit behavior during the period of interest, the emulator may continue emulating subsequent cycles of circuit behavior.

Other Uses of Interrupts

Interrupts can be used, for example, to temporarily halt the emulation process while some incidental activity is being carried out. For example an interrupt may be used to halt the emulation process while probe or snapshot data is being forwarded from RAM 93 to the workstation. Or, for example, testbench may include a statement such as the following:

If sync true('enable'==1)@clk then print b;

This statement says that if a signal called "enable" is true when a clock signal called "clk" is asserted, then the current value of a signal called "b" is to be printed on a printer. Since this kind of statement is intended to be executed by a computer, such as the workstation, having access to a printer. But when signals "enable", "b" and "clk" are produced and monitored on the local resource boards, having the workstation execute this statement can slow the emulation process. To resolve this problem resource controller 96 can be programmed to generate an interrupt when the signal conductions arise by generating an interrupt during which it writes the value of signal "b" to RAM 93 instead of printing it on a printer. Each FPGAs F1-F8 may also produce up to two interrupt outputs 101 that local bus controller 74 forwards to microprocessor 70 to initiate interrupt routines.

FPGA Allocation

Figure 18:
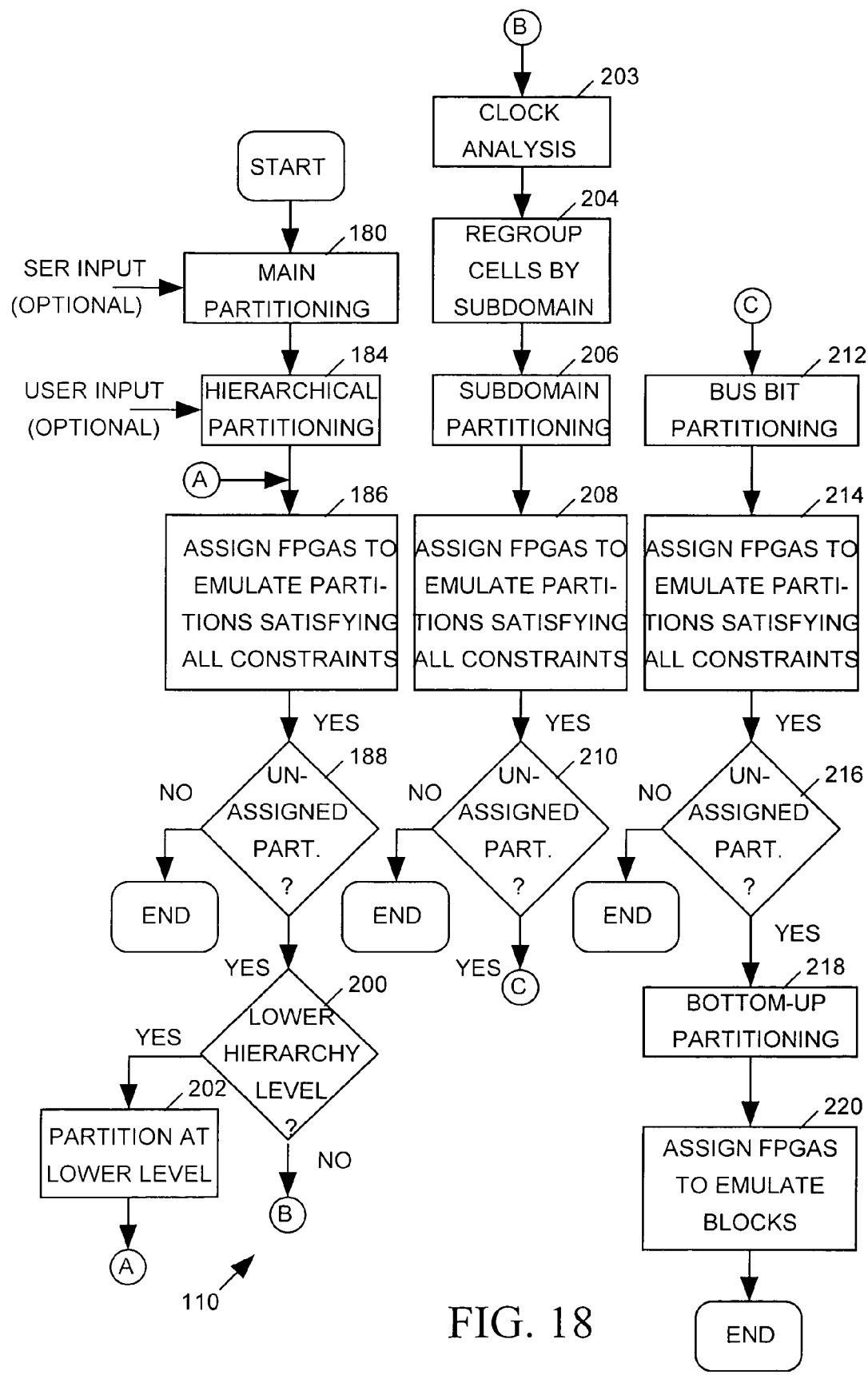
FIG. 18 is a data flow diagram illustrating the resource allocation step of FIG. 5 in more detail.

At step 110 of FIG. 9, the workstation allocates the various co-validation system resources for simulating or emulating each portion of the electronic circuit described by the netlist and also allocates resources for handling the vector generation and data acquisition functions described in the testbench. FIG. 18 depicts step 110 in more detail, with respect to the manner in which the workstation allocates FPGAs for emulating portions of the testbench. At step 180 the workstation carries out a main partitioning process in which it determines which portions of the testbench are to be simulated or emulated by the workstation, the FPGAs, and other resources. As discussed above in connection with FIG. 11, a user can tell the workstation how to allocate resources for emulating and simulating selected portions of the circuit described by the netlist. The workstation notifies the user when the user makes an improper allocation. For example, each resource board is capable of distributing a limited number of clock signals to the FPGAs with accurate skew control, and when the user directs the workstation to allocate resources in a manner that would require a resource board to distribute more than that limited number of clock signals to the FPGAs, it notifies the user that the allocation is improper.

Figure 19:
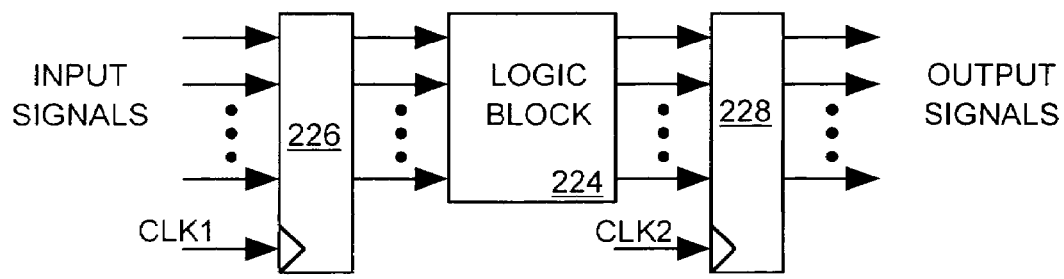
FIG. 19 illustrates a synchronous logic circuit in block diagram form.

The workstation next (step 203) carries out a clock analysis wherein it identifies all clock domains and subdomains and determines which cells belong to each subdomain. Digital ICs typically use register transfer logic wherein blocks of logic transmit data to one another via clocked circuit devices ("clock sinks") such as flip-flops and latches that ensure each block's input and output signals change state at predictable times. For example, FIG. 19 illustrates a block of logic 224 receiving and transmitting data signals through a synchronizing circuit including clock sinks 226 and 228 at the inputs and outputs of logic block 224. Clock sinks 226 and 228 ensure that state changes in the input and output signals of logic block 224 coincide with edges of the signals CLK1 and CLK2 clocking sinks 224 and 226. An IC designer chooses phase relationships between edges of clock signals CLK1 and CLK2 to allow logic block 224 sufficient time after a state change in its input signals following an edge of clock signal CLK1 to appropriately adjust states of its output signals before clock signal CLK2 clocks sinks 228. For example when CLK1 and CLK2 are the same clock signal and sinks 226 and 228 are both clocked on the leading edge of that clock signal, then logic block 224 will have one cycle of the clock signal to fully respond to a change in its input signals. When CLK1 and CLK2 are the same clock signal, but sink 226 is clocked on the leading edge that clock signal and sink 228 us clocked on the trailing edge of the clock signal, logic block 224 will have one half cycle of the clock signal to respond to a change in its input signals.

Clock signals CLK1 and CLK2 may differ, but to ensure proper phase relationships between clock signals, an IC normally employs clock logic circuits to derive them from a similar clock signal source so that edges of the two clock signals have a predictable and appropriate phase relationship. An IC receives its "primary" clock signals as inputs and derives all of its "secondary" clock signals from its primary clock signals. Each primary signal and each secondary clock signal derived from that primary clock signal reside in a clock "domain" associated with that primary clock signal. Each secondary clock signal also resides in a separate sub-domain of its primary clock signal's domain. The "phase" of each clock signal input to a clock sink relates to whether its rising or falling edge clocks the sink.

Figure 20:
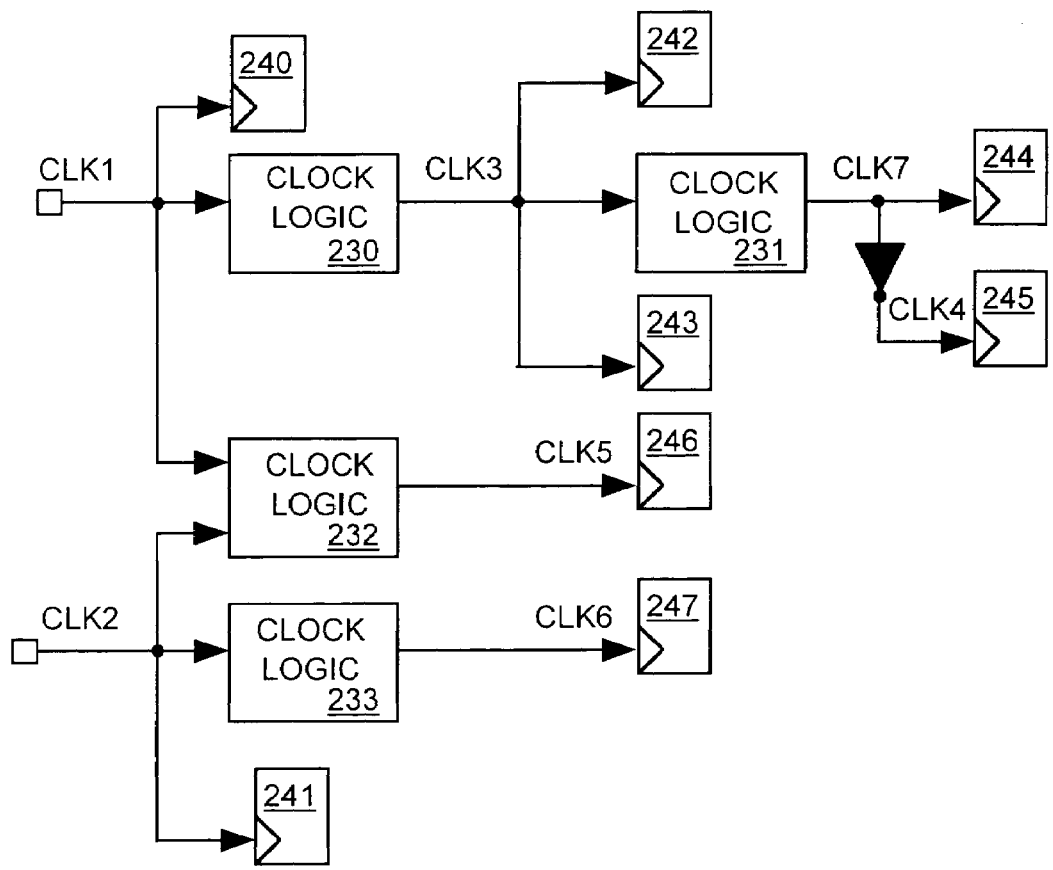
FIG. 20 illustrates a clock distribution system in block diagram form.

FIG. 20 is a block diagram illustrating a set of clock logic circuits 230-233 for deriving a set of secondary clock signals CLK3-CLK7 from a pair of primary clock signals CLK1 and CLK2. Clock signals CLK1-CLK7 clock various clock sinks 240-247. While each clock signal may clock many clock sinks, FIG. 20 shows only a few. The clock signal input to sink 240 resides in the domain of a primary clock signal CLK1 and the clock signal input to sink 241 resides in the domain of a primary clock signal CLK2. Clock signals CLK1 and CLK2 are primary clock signals defining separate clock domains when a netlist does not indicate they are derived from a similar clock signal or that one is derived from another. Any clock sink within the IC clocked by a secondary clock signal derived from a primarily clock resides in a sub-domain of that primary clock's clock domain. For example, clock signals clocking sinks 242 and 243 reside in the same sub-domain of the domain of clock signal CLK1 because they are produced at the same output of clock logic circuit 230. The clock signals clocking sinks 244 and 245 reside in another sub-domain of the domain of clock signal CLK1 because they are derived from CLK1 by another clock logic circuit 231. The clock signal input CLK5 to clock sink 246 is classified as being a "mixed domain" clock signal because it is produced by a clock logic circuit 232 that derives that clock signal from two different primary clock signals CLK1 and CLK2. Clock logic circuit 232 might be a multiplexer selectively using either CLK1 or CLK2 to drive CLK5, and in such case, the clock signal input to sink 246 would reside in two different clock domains. The clock signal inputs to sinks 242 and 243 reside in the same sub-domain and are of the same phase because they are both clocked by the same clock signal phase. The clock signal inputs CLK7 and CLK4 to sinks 244 and 245 reside the same sub-domain because they are derived from the same logic source, but they are of dissimilar phase because a leading clock signal edge clocks sink 244 while a trailing clock signal edge clocks sink 245.

The workstation next divides the portion of the netlist to be emulated by FPGAs into smaller partitions (step 184) where each partition consists of one or more modules at some level of the design hierarchy. A netlist typically describes and IC design hierarchically, with cell combining to form low-level modules, and lower level modules and cells combining to form higher-level modules. An IC design hierarchy may include many levels of modules.

The user may have specified how the portion of the netlist to be emulated by FPGAs is to be partitioned at step 184 by indicating which modules are to be assigned to each FPGA, as illustrated, for example in FIG. 11. Alternatively, the user may specify only that the design is to be partitioned with respect to a particular bus. For example, assume that modules 141-143 of FIG. 10 are to be simulated by the workstation that block 154 is to be emulated by memory resources, and that the remaining modules 145-152 are to be emulated by FPGAs. The user may specify at step 184 only that the portion of the design to be emulated by FPGAs is to be partitioned along bus 149. The workstation will then study the netlist at step 184 to identify partitions comprising modules residing at the highest level of the design hierarchy that communicate through bus 149. In the example of FIG. 10, the workstation would identify five partitions including modules 145, 146, 147 and 150 and the combination of modules 148 and 152.

In the absence of user input, the workstation automatically divides the portion of the netlist to be emulated by FPGAs into a few partitions containing modules residing at the highest level of the design hierarchy at step 184. In the example of FIG. 10, given that modules 141-143 are to be simulated and memory 154 is be emulated by memory resources, workstation would identify six partitions at the highest level of the design hierarchy to be emulated by FPGAs, wherein each module 146-150 and 152 forms a separate partition.

After partitioning the netlist at step 184, the workstation investigates each partition to determine whether there are any size or timing constraints that would prevent a single FPGA from emulating that partition. A size constraint relates to the fact that an FPGA is of limited size and may not be have a sufficient amount of logic resources to emulate a partition. A timing constraint relates to the notion that when IC logic is partitioned so that it can be emulated by two or more FPGAs, signal timing can be problematic when partitioning cuts across subdomain boundaries. The workstation assigns a separate FPGA for emulating each partition that would not violate any size or timing constraints at step 186.

The process ends at step 188 if there are no unassigned partitions. However, if there are any unassigned partitions, and the design has not already been partitioned at the lowest level of the design hierarchy (step 200), then the workstation divides the unassigned partitions at the next lowest level of the design hierarchy to create a smaller set of partitions and then returns to step 186. The process continues to loop through steps 186-202 until all partitions have been assigned at step 188 or until the unassigned partitions include only modules or cells residing at the lowest level of the design hierarchy.

If low-level partitions remain unassigned at step 200, the workstation repartitions the remaining unassigned portion of the netlist according to the clock subdomain in which the cells of that portion reside (step 204), such that each partition includes cells of a different subdomain (step 206). The workstation then assigns and FPGA to emulate each partition satisfying all size and timing constraints (step 208). The process ends at step 210 if FPGAs have been assigned to emulate all partitions. However, if any partitions remain unassigned at step 210, then the workstation further subdivides the partitions by "bus bit" (step 212). When the user has identified a multiple-bit bus at step 184 to provide a basis for initial partitioning, then the cells residing in the unassigned partition are reorganized at step 212 so that cells in either a fan-in or fan-out cone of a bit conveyed on a bus line are assigned to a separate partition. A cell is in a fan-in code of a bus bit if the cell's output signal can affect the state of the bit and is in the fan-out code of a bus bit line if a state of any of its input signals is affected by the bus bit. FPGAs are then assigned to emulated each of the partitions so established that satisfy all size and timing constraints (step 214).

The process ends if no partitions remain unassigned (step 216), however if any partitions remain unassigned, the workstation performs bottom-up partitioning on the cells forming the unassigned partitions (step 218) to form a new set of partitions sufficiently small to be emulated by FPGAs, and then assigns a separate FPGA to emulate each partition (step 220). In "bottom-up" partitioning at step 218, the workstation first identifies all blocks of unassigned cells residing between the same set of clock sinks. It then allocates the blocks among a set of partitions, each of which is sufficiently small to be emulated by a single FPGA.

The foregoing specification and the drawings depict an exemplary embodiment of the best mode of practicing the invention, and elements or steps of the depicted best mode exemplify the elements or steps of the invention as recited in the appended claims. However the appended claims are not necessarily limited to the exemplary embodiment of the invention described above. The claims are intended to apply to any mode of practicing the invention comprising the combination of elements or steps as described in any one of the claims, including elements or steps that are functional equivalents of the example elements or steps of the exemplary embodiment of the invention depicted in the specification and drawings.

The invention claimed is:

1. A method for configuring a co-verification system to simulate and emulate behavior of a circuit described by a netlist as comprising a hierarchy of modules communicating via circuit signals, wherein the co-verification system comprises a first computer, programmable emulation resources, and a communication path between the first computer and the emulation resources, the method comprising the steps of:
   a. processing the netlist to map the circuit signals to separate addresses of a memory space,
   b. selecting first partitions of the circuit described by the netlist to be emulated by the emulation resources and selecting second partitions of the circuit to be simulated by the first computer;
   c. programming the emulation resources to implement a first transactor and to emulate the first partitions by receiving, processing and generating emulator signals representing circuit signals;
   d. programming the first computer to implement a second transactor and to implement a simulator simulating the second partitions by acquiring, processing and generating signal data representing circuit signal states, wherein the simulator executes write instructions to write signal data it generates to addresses of the memory space to which the circuit signals are mapped and executes read instruction to acquire signal data it processes from address of the memory space to which the circuit signals are mapped;

wherein when the simulator executes a write instruction to write to the memory space signal data representing a state of a circuit signal represented by an emulation signal, the second transactor sends a write command indicating the state of the second signal via the communication path, and the first transactor responds to the write command by setting the emulation signal to the indicated state, and wherein when the simulator executes a read instruction to read from the memory space signal data representing a state of a circuit signal represented by an emulation signal, the second transactor transmits a read command via the communication path, the first transactor responds to the read command by determining a state of the emulation signal and returns signal data representing that state to the second transactor via the communication path, and the second transactor provides that signal data to the simulator in response to the read instruction.

2. The method in accordance with claim 1
wherein the communication path comprises a network,
wherein the emulation resources are identified by network addresses, and
wherein the second transactor sends read and write commands via packets addressed to emulation resources.

3. The method in accordance with claim 1
wherein the emulation resources include a first memory having first memory addresses for storing memory data,
wherein the netlist describes the circuit as including a second memory for storing memory data at a plurality of second memory addresses,
wherein the method further comprises a step of processing the netlist to map each second memory address to a corresponding address of the memory space,
wherein when the simulator writes memory data to an address of the memory space corresponding to any second memory address, the second transactor forwards that memory data in a write command via the communication path to the first transactor, and the first transactor writes that memory data into a first memory address of the first memory, and
wherein when the simulator reads data from an address of the memory space mapped to any second memory address, the second transactor sends a read command to the first transactor via the communication path, and the first transactor reads and returns to the second transactor via the communication path memory data stored at a first memory address of the first memory and the second transactor returns that memory data to the simulator.

4. The method in accordance with claim 1
wherein the netlist describes the circuit as including a first scan bus interconnecting the first partitions of the circuit to form a first scan chain, wherein the emulation resources are programmed at step c to provide a plurality of emulated partitions, each for emulating a corresponding one of the first partitions, and to provide a second scan bus interconnecting the emulated partitions to form a second scan chain, and wherein the emulated partitions are arranged in the second scan chain in an order that differs from an order in which the netlist describes their corresponding first partitions as being arranged to form the first scan chain.

5. The method in accordance with claim 1 wherein the netlist describes the circuit as comprising a first clock signal distribution system including a first clock logic circuit for receiving and processing at least one first primary clock signal to produce a plurality of first secondary clock signals for clocking the first partitions, wherein the emulation resources are programmed at step c to implement a second clock signal distribution including a second clock logic circuit for receiving at least one second primary clock signals and for generating a plurality of second secondary clock signals for clocking emulation resources emulating the first partitions, and wherein logic implemented by the first and second clock logic circuits differ.

6. The method in accordance with claim 1 wherein the emulation resources comprise a plurality of programmable logic devices (PLDs), and wherein step c comprises the substep of:

c1. for each first partition, determining whether a single PLD can emulate that first partition, and if so, assigning one of the PLDs to emulate that first partition, and for each first partition that a single PLD cannot emulate, and which includes modules residing other than at a lowest level of the hierarchy, dividing that first partition into smaller partitions, such that each smaller partition includes modules that are components of modules of the first partition, and assigning a separate PLD to emulate each smaller partition.

7. The method in accordance with claim 6 wherein the first partitions include cells, each residing in one of a plurality of clock subdomains, and wherein step c further comprises the substeps of:

c2. processing the netlist to identify all cells forming portions of the first partitions for which PLDs were not assigned to emulate at step c1, c3. assigning each cell identified at step c2 to one of a plurality of subdomain partitions of the netlist such that all cells assigned to each subdomain partition reside in the same one of the clock subdomains;

c4. for each subdomain partition, determining whether a single PLD can emulate the subdomain partition, and if so, assigning one of the PLDs to emulate that subdomain partition.

8. The method in accordance with claim 7 wherein the netlist describes the circuit as including a parallel bus having lines, each conveying a separate bit, wherein step c further comprises the substeps of:

c5. for subdomain partition for which a PLD was not assigned to emulate at step c4, and which includes cells in the fan-in and fan-out cones of bits conveyed on the parallel bus, dividing the subdomain partition into a plurality of bus bit partitions, each comprising cells in the fan-in or fan-out cone of a separate one of the bits conveyed on the parallel bus, c6. for each bus bit partition, determining whether a single PLD can emulate the cells of the bus bit partition, and if so, assigning one of the PLDs to emulate that bus bit partition.

9. The method in accordance with claim 8 wherein step c further comprises the substeps of:

c7. for all cells forming the first partitions for which cells no PLD is assigned to emulate at any of steps c1, c3 and c6, processing the netlist to identify blocks of these cells, c8. creating new partitions of the netlist, each containing at least one of the identified blocks of cells, and c9. assigning a separate FPGA to emulate each of the new partitions.

10. The method in accordance with claim 1 further comprising the steps of:

e. programming the emulation resources to transmit first snapshot data to the first computer via the communication path indicating states of emulator signals at a first point during emulation of the first partitions, and f. programming the first computer to also simulate behavior of the first partitions subsequent to the first point, with internal signals of the simulated first partitions set to initial states determined in accordance with the first snapshot data received from the emulation resources.

11. The method in accordance with claim 10 wherein the co-verification system comprises a second computer linked to the emulation resources and the first computer via the communication path, the method further comprising the steps of:

g. programming the emulation resources to transmit second snapshot data to the second computer via the communication path indicating states of emulator signals at a second point during emulation of the first partitions, and h. programming the second computer to simulate behavior of the second partitions subsequent to the second point, with internal signals of the simulated first partitions set to initial states determined in accordance with the second snapshot data received from the emulation resources.

12. Computer-readable media, which when read and executed by a computer, causes the computer to carry out a method for configuring a co-verification system to simulate and emulate behavior of a circuit described by a netlist as comprising a hierarchy of modules communicating via circuit signals, wherein the co-verification system comprises a first computer, programmable emulation resources, and a communication path between the first computer and the emulation resources, and wherein the method comprises the steps of:

a. processing the netlist to map the circuit signals to separate addresses of a memory space, b. selecting first partitions of the circuit described by the netlist to be emulated by the emulation resources and selecting second partitions of the circuit to be simulated by the first computer;

c. programming the emulation resources to implement a first transactor and to emulate the first partitions by receiving, processing and generating emulator signals representing circuit signals;

d. programming the first computer to implement a second transactor and to implement a simulator simulating the second partitions by acquiring, processing and generating signal data representing circuit signal states, wherein the simulator executes write instructions to write signal data it generates to addresses of the memory space to which the circuit signals are mapped and executes read instruction to acquire signal data it processes from address of the memory space to which the circuit signals are mapped;

wherein when the simulator executes a write instruction to write to the memory space signal data representing a state of a circuit signal represented by an emulation signal, the second transactor sends a write command indicating the state of the second signal via the communication path, and the first transactor responds to the write command by setting the emulation signal to the indicated state, and wherein when the simulator executes a read instruction to read from the memory space signal data representing a state of a circuit signal represented by an emulation signal, the second transactor transmits a read command via the communication path, the first transactor responds to the read command by determining a state of the emulation signal and returns signal data representing that state to the second transactor via the communication path, and the second transactor provides that signal data to the simulator in response to the read instruction.

13. The computer-readable media in accordance with claim 12 wherein the communication path comprises a network, wherein the emulation resources are identified by network addresses, and wherein the second transactor sends read and write commands via packets addressed to emulation resources.

14. The computer-readable media in accordance with claim 12 wherein the emulation resources include a first memory having first memory addresses for storing memory data, wherein the netlist describes the circuit as including a second memory for storing memory data at a plurality of second memory addresses, wherein the method further comprises a step of processing the netlist to map each second memory address to a corresponding address of the memory space, wherein when the simulator writes memory data to an address of the memory space corresponding to any second memory address, the second transactor forwards that memory data in a write command via the communication path to the first transactor, and the first transactor writes that memory data into a first memory address of the first memory, and wherein when the simulator reads data from an address of the memory space mapped to any second memory address, the second transactor sends a read command to the first transactor via the communication path, and the first transactor reads and returns to the second transactor via the communication path memory data stored at a first memory address of the first memory and the second transactor returns that memory data to the simulator.

15. The computer-readable media in accordance with claim 12 wherein the netlist describes the circuit as including a first scan bus interconnecting the first partitions of the circuit to form a first scan chain, wherein the emulation resources are programmed at step c to provide a plurality of emulated partitions, each for emulating a corresponding one of the first partitions, and to provide a second scan bus interconnecting the emulated partitions to form a second scan chain, and wherein the emulated partitions are arranged in the second scan chain in an order that differs from an order in which the netlist describes their corresponding first partitions as being arranged to form the first scan chain.

16. The computer-readable media in accordance with claim 12 wherein the netlist describes the circuit as comprising a first clock signal distribution system including a first clock logic circuit for receiving and processing at least one first primary clock signal to produce a plurality of first secondary clock signals for clocking the first partitions, wherein the emulation resources are programmed at step c to implement a second clock signal distribution including a second clock logic circuit for receiving at least one second primary clock signals and for generating a plurality of second secondary clock signals for clocking emulation resources emulating the first partitions, and wherein logic implemented by the first and second clock logic circuits differ.

17. The computer-readable media in accordance with claim 12 wherein the emulation resources comprise a plurality of programmable logic devices (PLDs), and wherein step c comprises the substep of:

c1. for each first partition, determining whether a single PLD can emulate that first partition, and if so, assigning one of the PLDs to emulate that first partition, and for each first partition that a single PLD cannot emulate, and which includes modules residing other than at a lowest level of the hierarchy, dividing that first partition into smaller partitions, such that each smaller partition includes modules that are components of modules of the first partition, and assigning a separate PLD to emulate each smaller partition.

18. The computer-readable media in accordance with claim 17 wherein the first partitions include cells, each residing in one of a plurality of clock subdomains, and wherein step c further comprises the substeps of:

c2. processing the netlist to identify all cells forming portions of the first partitions for which PLDs were not assigned to emulate at step c1, c3. assigning each cell identified at step c2 to one of a plurality of subdomain partitions of the netlist such that all cells assigned to each subdomain partition reside in the same one of the clock subdomains;

c4. for each subdomain partition, determining whether a single PLD can emulate the subdomain partition, and if so, assigning one of the PLDs to emulate that subdomain partition.

19. The computer-readable media in accordance with claim 18 wherein the netlist describes the circuit as including a parallel bus having lines, each conveying a separate bit, wherein step c further comprises the substeps of:

c5. for subdomain partition for which a PLD was not assigned to emulate at step c4, and which includes cells in the fan-in and fan-out cones of bits conveyed on the parallel bus, dividing the subdomain partition into a plurality of bus bit partitions, each comprising cells in the fan-in or fan-out cone of a separate one of the bits conveyed on the parallel bus, c6. for each bus bit partition, determining whether a single PLD can emulate the cells of the bus bit partition, and if so, assigning one of the PLDs to emulate that bus bit partition.

20. The computer-readable media in accordance with claim 19 wherein step c further comprises the substeps of:
  c7. for all cells forming the first partitions for which cells no PLD is assigned to emulate at any of steps c1, c3 and c6, processing the netlist to identify blocks of these cells,
  c8. creating new partitions of the netlist, each containing at least one of the identified blocks of cells, and
  c9. assigning a separate FPGA to emulate each of the new partitions.

21. The computer-readable media in accordance with claim 10 wherein the method further comprises the steps of:
  e. programming the emulation resources to transmit first snapshot data to the first computer via the communication path indicating states of emulator signals at a first point during emulation of the first partitions, and
  f. programming the first computer to also simulate behavior of the first partitions subsequent to the first point, with internal signals of the simulated first partitions set to initial states determined in accordance with the first snapshot data received from the emulation resources.

22. The computer-readable media in accordance with claim 21
  wherein the co-verification system comprises a second computer linked to the emulation resources and the first computer via the communication path, and
  wherein the method further comprises the steps of:
  g. programming the emulation resources to transmit second snapshot data to the second computer via the communication path indicating states of emulator signals at a second point during emulation of the first partitions, and
  h. programming the second computer to simulate behavior of the second partitions subsequent to the second point, with internal signals of the simulated first partitions set to initial states determined in accordance with the second snapshot data received from the emulation resources.

* * * * *